(12) United States Patent
Linstadt et al.

(10) Patent No.: US 12,230,355 B2
(45) Date of Patent: Feb. 18, 2025

(54) HIERARCHICAL BANK GROUP TIMING

(71) Applicant: Rambus Inc., San Jose, CA (US)

(72) Inventors: John Eric Linstadt, Palo Alto, CA (US); Liji Gopalakrishnan, Sunnyvale, CA (US); Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/634,370

(22) PCT Filed: Aug. 13, 2020

(86) PCT No.: PCT/US2020/046094
§ 371 (c)(1),
(2) Date: Feb. 10, 2022

(87) PCT Pub. No.: WO2021/041041
PCT Pub. Date: Mar. 4, 2021

(65) Prior Publication Data
US 2022/0328078 A1    Oct. 13, 2022

Related U.S. Application Data

(60) Provisional application No. 62/891,175, filed on Aug. 23, 2019.

(51) Int. Cl.
*G11C 7/10* (2006.01)
*G11C 7/22* (2006.01)

(52) U.S. Cl.
CPC .......... *G11C 7/1042* (2013.01); *G11C 7/1012* (2013.01); *G11C 7/1066* (2013.01); *G11C 7/1093* (2013.01); *G11C 7/22* (2013.01)

(58) Field of Classification Search
CPC ... G11C 7/1042; G11C 7/1012; G11C 7/1066; G11C 7/1093; G11C 7/22
See application file for complete search history.

(56) References Cited

U.S. PATENT DOCUMENTS 5,313,603 A    5/1994  Takishima
7,088,604 B2   8/2006  Shirley et al.
(Continued)

FOREIGN PATENT DOCUMENTS

WO    WO-2017-206000 A1    12/2017

OTHER PUBLICATIONS

Cho, Benjamin Y. et al., "CHoNDA: Near Data Acceleration with Concurrent Host Access", Aug. 18, 2019, ARXIV.org, Cornell University Library, XP081464772, arXiv:1908.06362v1, 14 pages.
(Continued)

*Primary Examiner* — Vanthu T Nguyen
(74) *Attorney, Agent, or Firm* — The Neudeck Law Firm, LLC

(57) ABSTRACT

The memory banks of a memory device are arranged and operated in groups and the groups are further arranged and operated as clusters of these groups. Successive accesses to banks that are within different bank group clusters may be issued at a first time interval. Successive accesses to banks that are within different bank groups within the same cluster can be issued no faster than a second time interval. And, successive accesses to banks that are within the same bank group may be issued no faster than a third time interval. The memory banks of a memory device may have multiple rows open at the same time. The rows that can be open at the same time is determined by the rows that are already open. These memory banks are also arranged and operated in groups that have three different minimum time intervals.

14 Claims, 16 Drawing Sheets

(56) References Cited

U.S. PATENT DOCUMENTS

| | | | |
|---|---|---|---|
| 7,587,545 B2 | 9/2009 | Kashiwaya et al. | |
| 7,755,953 B2 * | 7/2010 | Fujisawa | G11C 7/1018 |
| | | | 365/221 |
| 7,990,798 B2 | 8/2011 | Minzoni et al. | |
| 8,154,925 B2 * | 4/2012 | Moon | G11C 16/06 |
| | | | 365/185.11 |
| 8,406,074 B2 | 3/2013 | Kang | |
| 8,687,436 B2 | 4/2014 | Pawlowski | |
| 9,117,542 B2 | 8/2015 | Bains | |
| 9,190,138 B2 | 11/2015 | Song | |
| 9,728,245 B2 | 8/2017 | Bains et al. | |
| 10,074,413 B2 * | 9/2018 | Matsuoka | G11C 13/0069 |
| 10,241,941 B2 | 3/2019 | Fader et al. | |
| 10,671,319 B2 * | 6/2020 | Shin | G06F 3/0659 |
| 2011/0058421 A1 | 3/2011 | Warren | |
| 2014/0372682 A1 * | 12/2014 | Benedict | G11C 13/0002 |
| | | | 711/103 |
| 2016/0342539 A1 | 11/2016 | Bains | |
| 2017/0052714 A1 | 2/2017 | Garrett, Jr. | |
| 2017/0286017 A1 | 10/2017 | Ware et al. | |
| 2021/0286561 A1 * | 9/2021 | Bains | G11C 8/12 |

OTHER PUBLICATIONS

EP Extended European Search Report with Mail Date Jun. 15, 2023 re: EP Appln. No. 20858462.3. 11 pages.
Notification of Transmittal of the International Search Report and the Written Opinion of the International Searching Authority, or the Declaration with Mail Date Jan. 5, 2021 re: Int'l Appln. No. PCT/US2020/046094. 16 pages.
Wongyu Shin et al. "Bank-Group Level Parallelism" IEEE Transactions on Computers, vol. 66, No. 8, Aug. 2017. 7 pages.
EP Response as Filed on Dec. 29, 2023 in Response to the Extended European Search Report dated Jun. 15, 2023 and the Communication Pursuant Rules 70(2) and 70a(2) EPC dated Jul. 4, 2023. 23 pages.

* cited by examiner

HIERARCHICAL BANK GROUP TIMING

DETAILED DESCRIPTION OF THE EMBODIMENTS

Double-data rate (DDR) type dynamic random access memories (DRAMs) are organized into multiple memory banks that enable successive read or write accesses to an activated row, within a particular bank or bank group, at a frequency that is in the 100-200 MHz range. This maximum frequency of successive accesses may also be known as the core frequency (abbreviated herein as CF.) However, as integrated circuit fabrication technology advances, the input/output interface frequencies and bandwidths of these DRAMs are increasing from generation to generation in order to keep up with increasing application performance requirements and system clock frequencies/bandwidths.

In an embodiment, the memory banks of a memory device are arranged and operated in groups (i.e., bank groups) and the groups are further arranged and operated as clusters of these groups (i.e., bank group clusters.) In this arrangement, successive accesses to banks that are within different bank group clusters may be issued at a first (i.e., minimum) time interval (e.g., $t_{min}=[4\times CF]^{-1}$.) Successive accesses to banks that are within different bank groups within the same cluster can be issued no faster than a second (i.e., intermediate that is greater than the minimum) time interval (e.g., $t_{intmd}=[2\times CF]^{-1}$.) And, successive accesses to banks that are within the same bank group may be issued no faster than a third (i.e., maximum that is greater than the intermediate) time interval (e.g., $t_{max}=CF^{-1}$.)

In an embodiment, the memory banks of a memory device may have multiple rows open at the same time. When a row shares a sense amplifier with another row that is already open, the row may not be opened until the other row is closed. Thus, at any given time, some rows may be 'blocked' from being opened based on which rows are presently open. The memory banks are arranged and operated in groups (i.e., bank groups). Successive accesses to banks that are within different bank groups may be issued at a first (i.e., minimum) time interval (e.g., $t_{min}=[4\times CF]^{-1}$.) Successive accesses to banks that are within the same bank group can be issued no faster than a second (i.e., intermediate that is greater than the minimum) time interval (e.g., $t_{intmd}=[2\times CF]^{-1}$.) And, successive accesses to simultaneously open rows of the same bank may be issued no faster than a third (i.e., maximum that is greater than the intermediate) time interval (e.g., $t_{max}=CF^{-1}$.)

Figure 1:
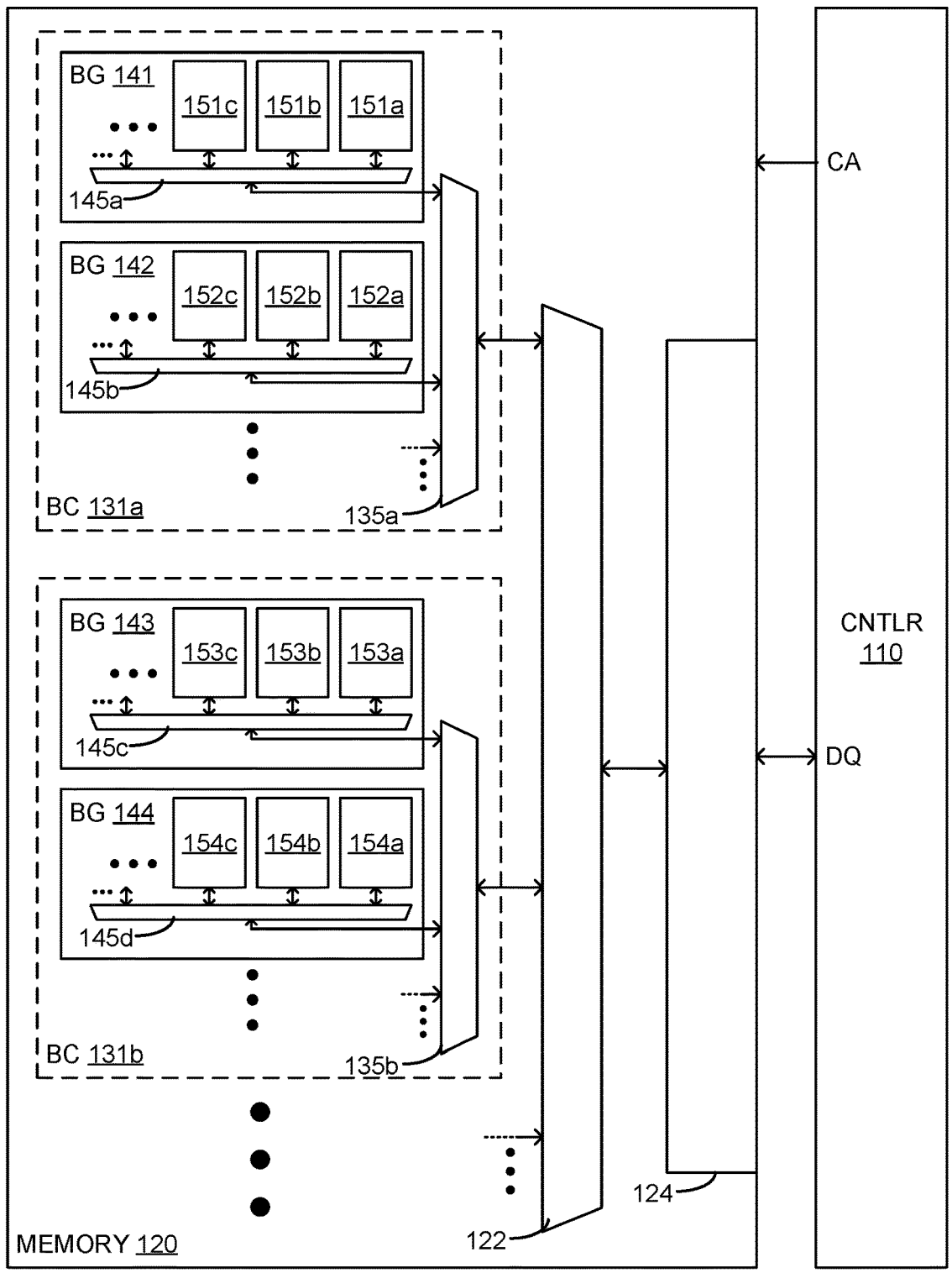
FIG. 1 is a block diagram of a memory system.

FIG. 1 is a block diagram of a memory system. In FIG. 1, memory system 100 comprises controller 110, and memory component 120. Memory component 120 includes memory banks 151a-151c, 152a-152c, 153a-153c, 154a-154c, multiplex/demultiplex (MUX/DEMUX) function 122, and data interface 124. Memory banks 151a-151c, 152a-152c, 153a-153c, 154a-154c are arranged and coupled as members of bank groups 141, 142, 143, 144, respectively. Bank groups 141-142 are arranged and coupled as members of bank group cluster 131a. Bank groups 143-144 are arranged and coupled as members of bank group cluster 131b. Additional memory banks, bank groups, and/or bank group clusters (not shown in FIG. 1 for the sake of brevity) may be included as parts of memory device 120.

Bank group 141 includes MUX/DEMUX function 145a. MUX/DEMUX function 145a is operatively coupled to memory banks 151a-151c and MUX/DEMUX function 135a of bank group cluster 131a. Bank group 142 includes MUX/DEMUX function 145b. MUX/DEMUX function 145b is operatively coupled to memory banks 152a-152c and MUX/DEMUX function 135a of bank group cluster 131a.

Bank group 143 includes MUX/DEMUX function 145c. MUX/DEMUX function 145c is operatively coupled to memory banks 153a-153c and MUX/DEMUX function 135b of bank group cluster 131b. Bank group 144 includes MUX/DEMUX function 145d. MUX/DEMUX function 145d is operatively coupled to memory banks 154a-154c and MUX/DEMUX function 135b of bank group cluster 131b.

MUX/DEMUX functions 135a-135b are operatively coupled to MUX/DEMUX function 122. MUX/DEMUX function 122 is operatively coupled to data interface 124. Data interface 124 is operatively coupled to controller 110.

Controller 110 and memory component 120 may be integrated circuit type devices, such as are commonly referred to as "chips". A memory controller, such as controller 110, manages the flow of data going to and from memory devices and/or memory modules. A memory controller can be a separate, standalone chip, or integrated into another chip. For example, a memory controller may be included on a single die with a microprocessor, or included as part of a more complex integrated circuit system such as a block of a system on a chip (SOC).

Controller 110 is operatively coupled to memory component 120 via at least one command address (CA) interface. Controller 110 is operatively coupled to memory component 120 to send commands to memory component 120. Memory component 120 receives the commands (and addresses) via a corresponding command address interface.

It should be understood that MUX/DEMUX functions 122, 135a-135b, and 145a-145d operate to steer data to/from their respective inputs and outputs. MUX/DEMUX functions 122, 135a-135b, and 145a-145d may be or comprise shared signal busses with local, intermediate, and/or global routing, pass-gates, multiplexors, demultiplexers, other logic, and/or tri-state buffers operatively coupled to drive and steer data to/from memory banks 151a-151c, 152a-152c, 153a-153c, 154a-154c and data interface 124.

The memory banks 151a-151c, 152a-152c, 153a-153c, 154a-154c of memory device 120 are arranged and operated in bank groups 141-144. Bank groups 141-144 are further arranged and operated as bank group clusters 131a-131b. Thus, memory device 120 is configured as a three-level hierarchical grouping of banks ($1^{st}$ level) into bank groups ($2^{nd}$ level), and bank groups into bank group clusters ($3^{rd}$ level.)

In an embodiment, the hierarchical grouping of banks determines the minimum successive access timing between different banks. In particular, successive accesses to different banks that are within the same bank group require a longer time between accesses than successive accesses to banks that are in a different bank group. Also, successive accesses to different banks that are within the same bank group cluster require a longer time between accesses than successive accesses to banks that are in a different bank group cluster.

As set forth herein, it should be understood that the column to column minimum delay intervals described herein are merely an example. The hierarchical grouping of banks also affect the command to like (or same) command timing minimum delay intervals Some example command to command delay interval parameters are given in Table 1.

TABLE 1

| Timing Parameter | Description |
| --- | --- |
| $t_{CCD\_L}$ | Column to column delay (long) for banks in the same bank group and bank group cluster |
| $t_{CCD\_M}$ | Column to column delay (medium) for banks in the same bank group cluster but different bank groups |
| $t_{CCD\_S}$ | Column to column delay (short) for banks in different bank group clusters |
| $t_{RRD\_L}$ | Activate row to activate row delay (long) for banks in the same bank group and bank group cluster |
| $t_{RRD\_M}$ | Activate row to activate row delay (medium) for banks in the same bank group cluster but different bank groups |
| $t_{RRD\_S}$ | Activate row to activate row delay (short) for banks in different bank group clusters |
| $t_{WTR\_L}$ | Delay from start of an internal write transaction to an internal read command (long) for banks in the same bank group and bank group cluster |
| $t_{WTR\_M}$ | Delay from start of an internal write transaction to an internal read command (medium) for banks in the same bank group cluster but different bank groups |
| $t_{WTR\_S}$ | Delay from start of an internal write transaction to an internal read command (short) for banks in different bank group clusters |

It should also be understood that a similar set of hierarchical timing constraints, with different values, may be specified for devices that have different back-to-back delay intervals for read as compared to write operations (e.g., $t_{CCD\_RD\_L} \neq t_{CCD\_WR\_L}$, $t_{CCD\_RD\_M} \neq t_{CCD\_WR\_M}$, etc.) However, for the sake of brevity, the discussion herein is limited read operation and write operation timings that are assumed to be equal (i.e., (e.g., $t_{CCD\_RD\_L} = t_{CCD\_WR\_L}$, $t_{CCD\_RD\_M} = t_{CCD\_WR\_M}$, etc.) Memory devices that that have internal error correction code circuitry are an example of memory devices that may have different read operation and write operation timings.

For example, when successive accesses are to bank 151a and then bank 151c, the data associated with the second access (i.e., to/from bank 151c) needs to propagate through MUX/DEMUX function 145a, MUX/DEMUX function 135a, and MUX/DEMUX function 122 to reach or be sourced from interface 124. However, when successive accesses are to bank 151a (in bank group 141 of bank group cluster 131a) and then bank 152b (in bank group 142 of bank group cluster 131a), the data associated with the second access (i.e., to/from bank 152b) can be waiting at the input/output of MUX/DEMUX function 145b and therefore does not need to propagate through MUX/DEMUX function 145a before propagating through MUX/DEMUX function 135a, and MUX/DEMUX function 122 to reach or be sourced from interface 124. Thus, the timing between successive accesses to different banks that are within the same bank group is specified as a longer time than successive accesses to different banks that are in different bank groups.

Using column to column operations as an example, the interval between back-to-back column accesses to different banks that are both within the same bank group (a.k.a., "long" $t_{CCD\_L}$ which may be in the range of 5-10 ns) is specified as a longer time than successive column accesses to banks that are not in the same bank group (e.g., $t_{CCD\_M}$ in the range of 2.5-5 ns). In another example, the interval between back-to-back row accesses to different banks that are both within the same bank group (a.k.a., "long" $t_{RRD\_L}$) is specified as a longer time than successive row accesses to banks that are not in the same bank group (e.g., $t_{RRD\_M}$).

The hierarchical grouping of banks also determines the minimum back-to-back access timing between banks that are in different bank group clusters. In particular, successive accesses to banks that are within the same bank group cluster require a longer time between accesses than successive accesses to banks that are in a different bank group cluster.

For example, when successive accesses are to bank 151a (in bank group 141 of bank group cluster 131a) and then bank 152b (in bank group 142 of bank group cluster 131a), the data associated with the second access (i.e., to/from bank 152b) needs to propagate through MUX/DEMUX function 135a before propagating through MUX/DEMUX function 122 to reach or be sourced from interface 124. However, when successive accesses are to bank 151a (in bank group 141 of bank group cluster 131a) and then bank 154b (in bank group 144 of bank group cluster 131b), the data associated with the second access (i.e., to/from bank 154b) can be waiting at the input/output of MUX/DEMUX function 122 and therefore does not need to propagate through MUX/DEMUX function 135a before propagating through MUX/DEMUX function 122 to reach or be sourced from interface 124. Thus, the timing between successive accesses to different banks that are within the same bank group cluster (e.g., $t_{CCD\_M}$) is specified as a longer time than successive accesses to banks that are in different a bank group cluster (e.g., $t_{CCD\_S}$ in the range of 1.25-2.5 ns).

Put another way, successive accesses to different bank group clusters may be issued at a first (i.e., minimum) time interval (e.g., $t_{min}=[4 \times CF]^{-1}$ as governed by $t_{CCD\_S}$.) Successive accesses to banks that are within different bank groups within the same cluster can be issued no faster than a second (i.e., intermediate that is greater than the minimum) time interval (e.g., $t_{intmd}=[2 \times CF]^{-1}$ as governed by $t_{CCD\_M}$.) And, successive accesses to banks that are within the same bank group may be issued no faster than a third (i.e., maximum that is greater than the intermediate) time interval (e.g., $t_{max}=CF^{-1}$ as governed by $t_{CCD\_L}$.) These timings are further illustrated with reference to FIG. 2.

Controller 110 includes scheduling logic (not shown in FIG. 1) to issue, to memory device 120, accesses to memory banks 151a-151c, 152a-152c, 153a-153c, 154a-154c.

Again, using column to column minimum delay as an example, the scheduling logic of controller 110 may use first column to column delay ($t_{CCD\_S}$) for successive column accesses to memory banks 151a-151c, 152a-152c, 153a-153c, 154a-154c that are members of different bank group clusters 131a-131b. The scheduling logic of controller 110 may use a second column to column delay ($t_{CCD\_M}$) for successive column accesses to memory banks 151a-151c, 152a-152c that are members of the same bank group cluster (e.g., 131a) but different bank groups of that bank group cluster (e.g., bank group 141 and bank group 142 of bank group cluster 131a). The scheduling logic of controller 110 may use a third column to column delay ($t_{CCD\_L}$) for successive column accesses to memory banks 151a-151c that are members of the same bank group (e.g., bank group 141) and same bank group cluster (e.g., 131a.)

In another example using row to row operations, the scheduling logic of controller 110 may use first row to row delay ($T_{RRD\_S}$) for successive row accesses to memory banks 151a-151c, 152a-152c, 153a-153c, 154a-154c that are members of different bank group clusters 131a-131b. The scheduling logic of controller 110 may use a second row to row delay ($T_{RRD\_M}$) for successive row accesses to memory banks 151a-151c, 152a-152c that are members of the same bank group cluster (e.g., 131a) but different bank groups of that bank group cluster (e.g., bank group 141 and bank group 142 of bank group cluster 131a). The scheduling logic of controller 110 may use a third row to row delay ($T_{RRD\_L}$) for successive row accesses to memory banks 151a-151c that are members of the same bank group (e.g., bank group 141) and same bank group cluster (e.g., 131a.)

It should be understood that memory components (e.g. memory component 120) may receive a clock signal that serves as a timing reference. The intervals described herein may thus be expressed as a number of cycles of the reference clock frequency. Because memory components may be operated at different reference clock frequencies, the intervals described herein may be expressed in terms of intervals that are rounded up to an integer number of clock cycles (or phases) of the timing reference.

Figure 2:
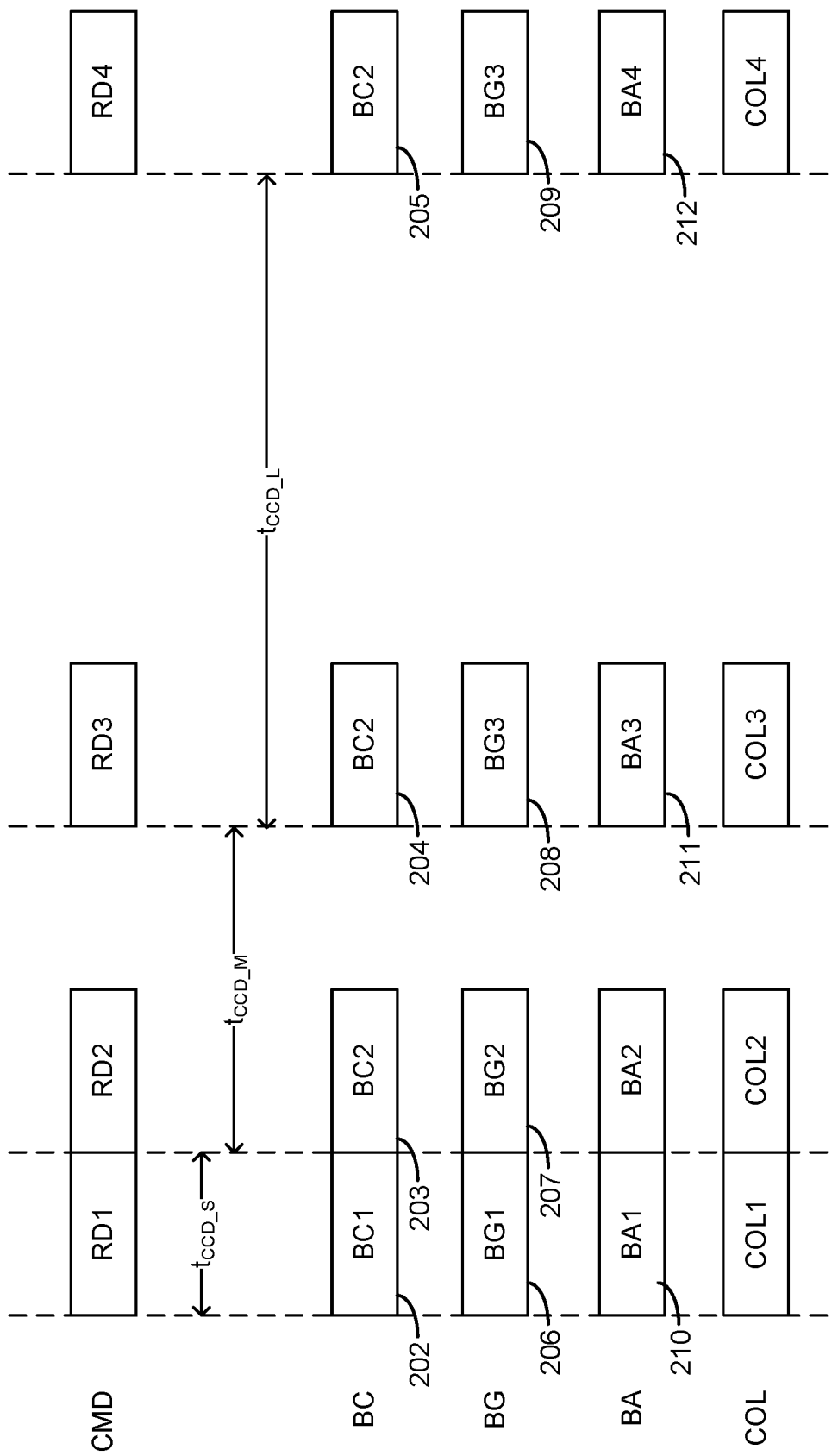
FIG. 2 is an illustration of multiple command to command delays.

FIG. 2 is an illustration of multiple command to command delays. In FIG. 2, column accesses are used as example commands for illustration purposes. However, other types of commands and delays (e.g., those detailed in Table 1) may follow a similar or equivalent pattern. A first example read command (RD1) is issued by controller 110 and received by memory component 120. The address associated with the RD1 command specifies the bank group cluster address as BC1 202, the bank group address as BG1 206, the bank address as BA1 210, and the column address as COL1. If, for a subsequent command, a new bank group cluster address is provided (e.g., BC2 where BC1≠BC2) the subsequent command may be issued/received in the shortest amount of time later (i.e., $t_{CCD\_S}$) or greater after the first command. This timing is illustrated in FIG. 2 by the $t_{CCD\_S}$ delay from the first read command (RD1) to the second read command (RD2) and the change in bank group cluster address from BC1 202 to BC2 203. Note that as long as BC1 BC2, there are no additional constraints on the subsequent bank group (BG2), bank address (BA2), and/or column (COL2) addresses in order to issue/receive the successive command in the shortest amount of time later (i.e., $t_{CCD\_S}$).

If, for a subsequent command (RD3) after the second command (RD2), the bank group cluster address is the same as the second command (BC2), but a new bank group address is provided (e.g., BG3 BG2) the subsequent (RD3) command may be issued/received at the intermediate amount of time (i.e., $t_{CCD\_M}$) or greater after the second command. This timing is illustrated in FIG. 2 by the $t_{CCD\_M}$ delay from the second read command (RD2) to the third read command (RD3), the same bank group cluster address BC2 203 and 204, and the change in bank group address from BG2 207 to BG3 208. Note that when the bank group cluster address is the same as the previous command, and a new bank group address is provided (e.g., BG3), there are no additional constraints on the bank address (BA3), and/or column (COL3) addresses in order to issue/receive the successive command in the intermediate amount of time later (i.e., $t_{CCD\_M}$).

If, for a subsequent command (RD4) after the third command (RD3), the bank group cluster address and the bank group are the same as the third command, but a new bank address is provided (e.g., BA4≠BA3) the subsequent command may be issued/received the longest amount of time later (i.e., $t_{CCD\_L}$) or greater after the third command. This timing is illustrated in FIG. 2 by the $t_{CCD\_L}$ delay from the third read command (RD3) to the fourth read command (RD4), the same bank group cluster address BC2 204 and 204, the same bank group address BG3 208 and 209, and the change in the bank address from BA3 211 to BA4 212. Note that when the bank group cluster address and the bank group are the same as the previous command, and a new bank address is provided (e.g., BA4), there are no additional constraints on the column (COL) address in order to issue/receive the successive command in the longest amount of time later (i.e., $t_{CCD\_L}$). Table 2 summarizes the timing constraints described herein with reference to FIG. 2.

TABLE 2

| Command address | Next Command address | Timing Constraint |
| --- | --- | --- |
| BC1, BG1, and BA1 | BC2 ≠ BC1, BG2, BA2 | $t_{CCD\_S}$ |
| | BC2 = BC1, BG2 ≠ BG1, BA2 | $t_{CCD\_M}$ |
| | BC2 = BC1, BG2 = BG1, BA2 | $t_{CCD\_L}$ |

In an embodiment, the scheduling logic of controller 110, and/or memory component 120, may be configured (e.g., by registers or commands) to use the longest timings for all back-to-back accesses. When in this mode, the scheduling performed by controller 110, and the internal timings of memory device 120, are simplified. However, when in the hierarchical (i.e., bank group cluster) mode described herein with reference to FIGS. 1-2, the better optimized multi-level timings may be used based on the accesses.

Figure 3:
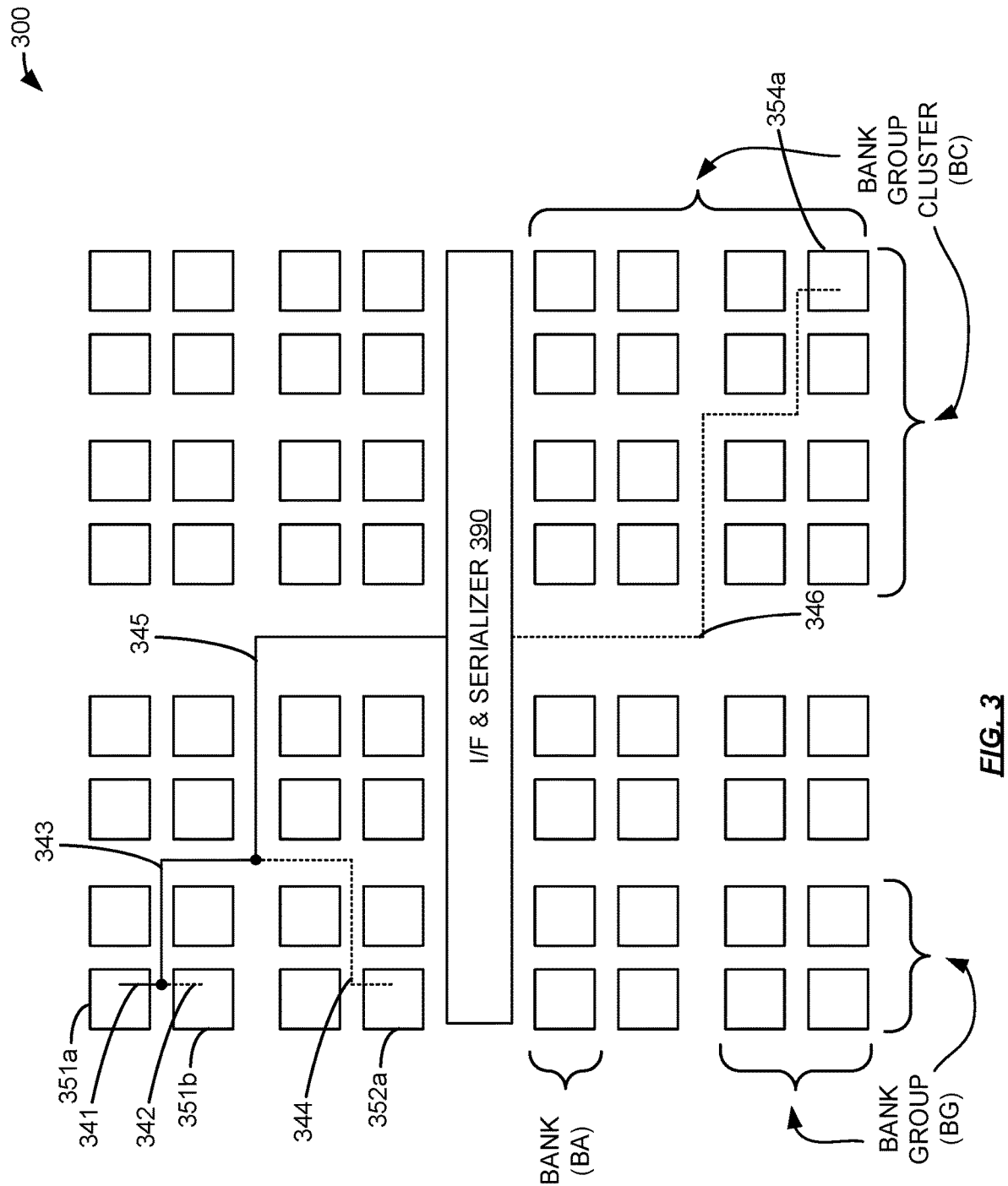
FIG. 3 is a notional illustration of a physical arrangement of banks in a memory device and example signal paths.

FIG. 3 is a notional illustration of a physical arrangement of banks in a memory device and example signal paths. In FIG. 3, arrays of memory banks are hierarchically grouped into bank groups and the bank groups grouped into bank group clusters. A first signal path runs between bank 351a to interface and serializer 390. Data is transferred between bank 351a and datapath circuitry shared within a bank group (e.g., MUX/DEMUX functions, buffers, common signal lines, logic, etc.). This is illustrated in FIG. 3 by lines 341 (between bank 351a and line 343) and 342 (between bank 351b and line 343). The datapath circuitry shared within the same bank group may run at a core frequency governed by the longest column to column delay timing (e.g., $t_{CCD\_L}$=5-10 ns for a 100-200 MHz cycle frequency.)

Data is transferred between datapath circuitry shared within a bank group and datapath circuitry shared within a bank group cluster. This is illustrated in FIG. 3 by lines 343 (between bank 351*a*'s bank group and line 345) and 344 (between bank 352*a*'s bank group and line 345). The datapath circuitry shared within the same bank group cluster may run at a frequency governed by the intermediate column to column delay timing (e.g., $t_{CCD\_M}$=2.5-5 ns for a 200-400 MHz cycle core frequency.)

Data is transferred between datapath circuitry shared within a bank group cluster and datapath circuitry shared between all bank group clusters. This is illustrated in FIG. 3 by lines 345 (between bank 351*a*'s bank group cluster and serializer 390) and 346 (between bank 354*a*'s bank group cluster and serializer 390). The datapath circuitry shared between bank group clusters may run at a frequency governed by the shortest column to column delay timing (e.g., $t_{CCD\_S}$=1.25-2.5 ns for a 400-800 MHz cycle frequency.)

Figure 4:
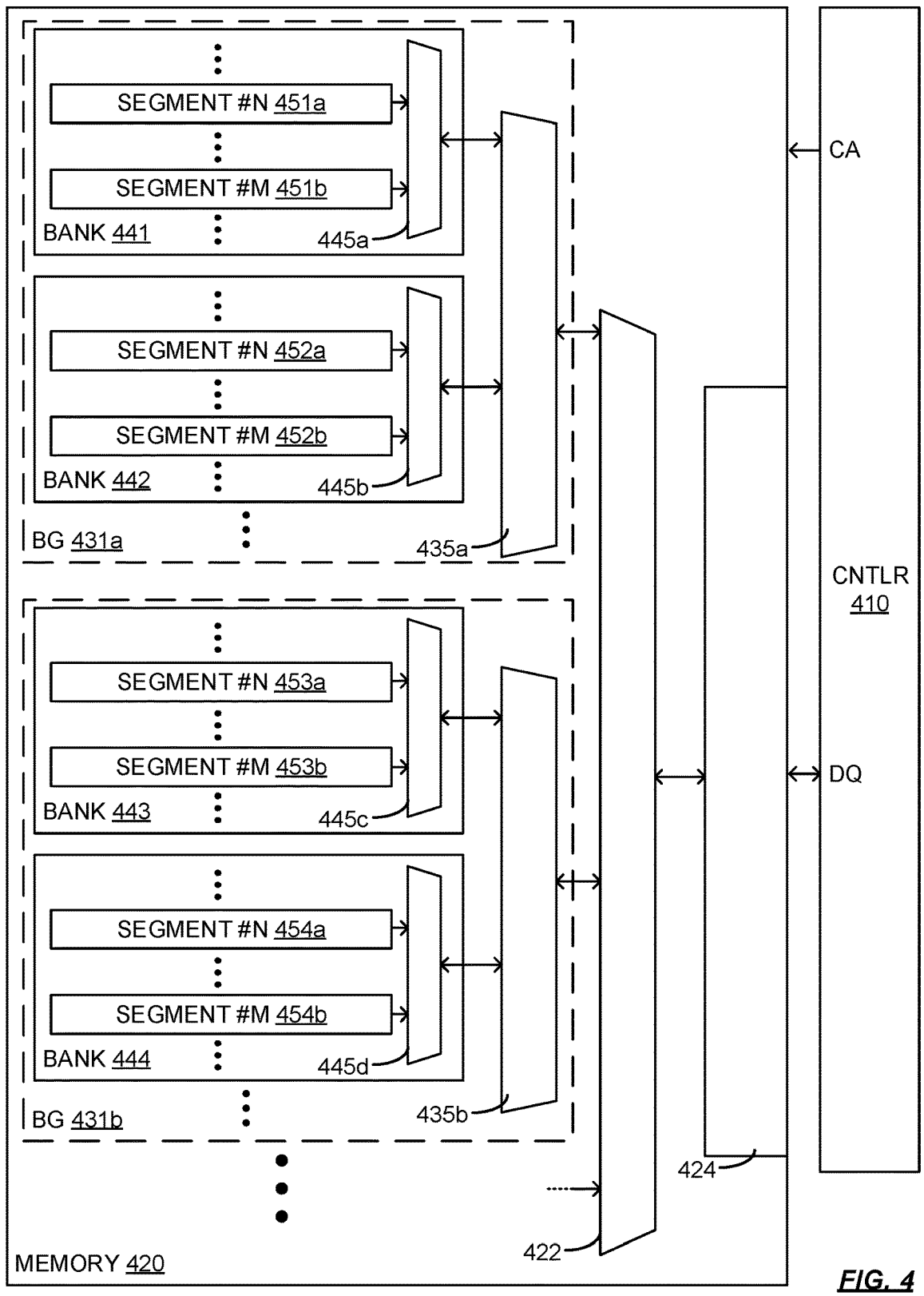
FIG. 4 is an illustration of a memory system.

FIG. 4 is an illustration of a memory system. In FIG. 4, memory system 400 comprises controller 410, and memory component 420. Memory component 420 includes memory banks 441-444, multiplex/demultiplex (MUX/DEMUX) function 422, and data interface 424. Memory banks 441-442 are arranged and coupled as members of bank group 431*a*. Memory banks 443-444 are arranged and coupled as members of bank group 431*b*. Additional memory banks, bank groups, and/or bank group clusters (not shown in FIG. 4 for the sake of brevity) may be included as parts of memory device 420.

Bank group 431*a* also includes MUX/DEMUX function 435*a*. MUX/DEMUX function 435*a* is operatively coupled to memory banks 441-442. Memory bank 441 includes MUX/DEMUX function 445*a*. Memory bank 442 includes MUX/DEMUX function 445*b*. MUX/DEMUX functions 445*a*-445*b* are operatively coupled to MUX/DEMUX function 435*a*.

Bank group 431*b* also includes MUX/DEMUX function 435*b*. MUX/DEMUX function 435*b* is operatively coupled to memory banks 443-444. Memory bank 443 includes MUX/DEMUX function 445*c*. Memory bank 444 includes MUX/DEMUX function 445*d*. MUX/DEMUX functions 445*c*-445*d* are operatively coupled to MUX/DEMUX function 435*b*.

MUX/DEMUX functions 435*a*-435*b* are operatively coupled to MUX/DEMUX function 422. MUX/DEMUX function 422 is operatively coupled to data interface 424. Data interface 424 is operatively coupled to controller 410.

Controller 410 and memory component 420 may be integrated circuit type devices, such as are commonly referred to as a "chips". A memory controller, such as controller 410, manages the flow of data going to and from memory devices and/or memory modules A memory controller can be a separate, standalone chip, or integrated into another chip. For example, a memory controller may be included on a single die with a microprocessor, or included as part of a more complex integrated circuit system such as a block of a system on a chip (SOC).

Controller 410 is operatively coupled to memory 420 via at least one command address (CA) interface. Controller 410 is operatively coupled to memory 420 to send commands to memory 420. Memory 420 receives the commands (and addresses) via a corresponding command address interface.

It should be understood that MUX/DEMUX functions 422, 435*a*-435*b*, and 445*a*-445*d* operate to steer data to/from their respective inputs and outputs. MUX/DEMUX functions 422, 435*a*-435*b*, and 445*a*-445*d* may be or comprise shared signal busses with local, intermediate, and/or global routing, pass-gates, multiplexors, demultiplexers, other logic, and/or tri-state buffers operatively coupled to drive and steer data to/from rows of memory banks 441-444 and data interface 424.

Memory device 420 may have multiple rows in the same bank 441-444 open concurrently. Controller 410 divides the address space of banks 441-444 into segments 451*a*-451*b*, 452*a*-452*b*, 453*a*-453*b*, 454*a*-454*b* based on row address ranges. These row address ranges do not necessarily correspond to row address ranges of the bank's 441-444 subarrays (a.k.a. memory array tiles—MATs). When a command is sent to open a row, controller 410 marks a plurality of the segments (i.e., row address ranges) as blocked. Controller 410 thereby tracks address ranges in a bank 441-444 where it will not open a second row unless and until the first row is closed. In an embodiment, memory device 420 may store information about which, and how many, segments should be blocked in response to opening a row. This information may be read by controller 410 during initialization.

Because more than one row in a bank may be open concurrently, column access operations sent to memory 420 specify which row is the subject of the column access. In an embodiment, the entire row address is used to specify the subject row. In another embodiment, a map of open rows to tag values is maintained by memory 420. Controller 410 sends a tag value to specify the subject row. These tag values may be generated, for example, using a function (e.g., hash) of the row address, using a count of the open rows, or using a priority encoder.

In an embodiment, memory 420 is configured such that multiple rows in the same bank 441-444 may be open concurrently as long as the open rows are in segments 451*a*-451*b*, 452*a*-452*b*, 453*a*-453*b*, 454*a*-454*b* that do not interfere with each other. Thus, for example, when memory 420 activates a row in bank 441, the sense amplifier stripes surrounding the row are used to activate the addressed row and the rest of the sense amplifier stripes in the bank 441 do not participate in the activation.

Controller 410 may include a scheduler. The scheduler selects transactions/commands to be sent to memory 420. This scheduler may maintain respective address tables for banks 441-444 that indicate which address ranges (i.e., segments 451*a*-451*b*, 452*a*-452*b*, 453*a*-453*b*, 454*a*-454*b*) are blocked due to open rows. The entries in the address tables may correspond to respective address ranges (i.e., segments) and hold one or more indicators of whether the address range is available or unavailable for opening a row in that address range. The entries in the address tables may comprise a single bit or other value corresponding to whether or not the address range is available for opening a row. The entries in the address tables may comprise a value that tracks when an address range will become available. For example, when memory 420 is configured to auto-precharge, a timer value may be incremented or decremented under certain conditions to track when the precharge will be complete and therefore the address range becomes available.

Further discussion of segments 451*a*-451*b*, 452*a*-452*b*, 453*a*-453*b*, 454*a*-454*b*, memory device 420, and their operation and control by controller 410 is provided in U.S. Provisional patent application 62/835,717, filed Apr. 18, 2019, titled "MEMORY SYSTEM WITH MULTIPLE OPEN ROWS PER BANK", which is hereby incorporated herein, in its entirety, for all purposes.

The memory banks 441-444 of memory device 420 are arranged and operated in bank groups 431*a*-431*b*. Thus, memory device 420 may be viewed as a three-level hierarchical grouping of segments (1$^{st}$ level) into banks (2$^{nd}$ level), and banks into bank groups (3$^{rd}$ level.)

In an embodiment, the hierarchical grouping of segments, banks, and bank groups determines the minimum successive access timing between different segments. In particular, successive accesses to different (non-blocked) segments that are within the same bank require a longer time between accesses than successive accesses to segments that are in a different bank group.

As set forth herein, it should be understood that the column to column minimum delay intervals described herein are merely an example. The hierarchical grouping of segments, banks, and bank groups also affect the command to like (or same) command timing minimum delay intervals Some example command to command delay interval parameters are given in Table 3.

TABLE 3

| Timing Parameter | Description |
| --- | --- |
| $t_{CCD\_L}$ | Column to column delay (long) for segments in the same bank and therefore bank group |
| $t_{CCD\_M}$ | Column to column delay (medium) for segments in the same bank group but different banks |
| $t_{CCD\_S}$ | Column to column delay (short) for segments in different bank groups |
| $t_{RRD\_L}$ | Activate row to activate row delay (long) for segments in the same bank and therefore bank group |
| $t_{RRD\_M}$ | Activate row to activate row delay (medium) for segments in the same bank group but different banks |
| $t_{RRD\_S}$ | Activate row to activate row delay (short) for segments in different bank groups |
| $t_{WTR\_L}$ | Delay from start of an internal write transaction to an internal read command (long) for segments in the same bank and therefore bank group |
| $t_{WTR\_M}$ | Delay from start of an internal write transaction to an internal read command (medium) for segments in the same bank group but different banks |
| $t_{WTR\_S}$ | Delay from start of an internal write transaction to an internal read command (short) for segments in different bank groups |

It should also be understood that a similar set of set of hierarchical timing constraints, with different values, may be specified for devices that have different back-to-back delay intervals for read as compared to write operations (e.g., $t_{CCD\_RD\_L} \neq t_{CCD\_WR\_L}$, $t_{CCD\_RD\_M} \neq t_{CCD\_WR\_M}$, etc.) However, for the sake of brevity, the discussion herein is limited read operation and write operation timings that are assumed to be equal (i.e., (e.g., $t_{CCD\_RD\_L} = t_{CCD\_WR\_L}$, $t_{CCD\_RD\_M} = t_{CCD\_WR\_M}$, etc.)

Using column to column operations as an example, when successive accesses are to segment 451a and then segment 451b, the data associated with the second access (i.e., to/from segment 451b) needs to propagate through MUX/DEMUX function 445a, MUX/DEMUX function 435a, and MUX/DEMUX function 422 to reach or be sourced from interface 424. However, when successive accesses are to segment 451a (in bank 441 of bank group 431a) and then segment 452b (in bank 442 of bank group 431a), the data associated with the second access (i.e., to/from segment 452b) can be waiting at the input/output of MUX/DEMUX function 445b and therefore does not need to propagate through MUX/DEMUX function 445a before propagating through MUX/DEMUX function 435a, and MUX/DEMUX function 422 to reach or be sourced from interface 424. Thus, the timing between successive accesses to different segments that are within the same bank (e.g., $t_{CCD\_L}$ in the range of 5-10 ns) is specified as a longer time than successive accesses to segments that are in a different bank (e.g., $t_{CCD\_M}$ in the range of 2.5-5 ns).

The hierarchical grouping of segments also determines the minimum column to column access timing between segments that are in different bank groups. In particular, successive accesses to segments that are within the same bank group require a longer time between accesses than successive accesses to segments that are in a different bank group.

Continuing with using column to column operations as an example, when successive accesses are to segment 451a (in bank group 431a) and then to segment 452a (in bank group 431a), the data associated with the second access (i.e., to/from segment 452a) needs to propagate through MUX/DEMUX function 435a before propagating through MUX/DEMUX function 422 to reach or be sourced from interface 424. However, when successive accesses are to segment 451a (in bank group 431a) and then segment 454b (in bank group 431b), the data associated with the second access (i.e., to/from segment 454b) can be waiting at the input/output of MUX/DEMUX function 422 and therefore does not need to propagate through MUX/DEMUX function 435a before propagating through MUX/DEMUX function 422 to reach or be sourced from interface 424. Thus, the timing between successive accesses to different banks that are within the same bank group (e.g., $t_{CCD\_M}$) is specified as a longer time than successive accesses to banks that are in different a bank groups (e.g., $t_{CCD\_S}$ in the range of 1.25-2.5 ns).

Put another way, successive accesses to segments that are in different bank groups may be issued at a first (i.e., minimum) time interval (e.g., $t_{min} = [4 \times CF]^{-1}$ as governed by $t_{CCD\_S}$.) Successive accesses to segments that are in different banks within the same bank group can be issued no faster than a second (i.e., intermediate that is greater than the minimum) time interval (e.g., $t_{intmd} = [2 \times CF]^{-1}$ as governed by $t_{CCD\_M}$.) And, successive accesses to (non-blocked) segments that are within the same bank may be issued no faster than a third (i.e., maximum that is greater than the intermediate) time interval (e.g., $t_{max} = CF^{-1}$ as governed by $t_{CCD\_L}$.) These timings are further illustrated with reference to FIG. 5.

The scheduling logic of controller 410 issues, to memory device 420, accesses to segments 451a-451b, 452a-452b, 453a-453b, 454a-454b. Again using column to column minimum delay as an example, the scheduling logic of controller 410 may use a first column to column delay ($t_{CCD\_S}$) for successive accesses to segments 451a-451b, 452a-452b, 453a-453b, 454a-454b that are parts of banks that are part of different bank groups 431a-431b, and a second column to column delay ($t_{CCD\_M}$) for successive accesses to memory segments 451a-451b, 452a-452b, 453a-453b, 454a-454b that are members of a first bank group (e.g., 131a) and different banks of the first bank group (e.g., bank 441 and bank 442 of bank group 431a). The scheduling logic of controller 110 uses a third column to column delay ($t_{CCD\_L}$) for successive accesses to segments 451a-451b that are members of a first bank (e.g., bank 441) of the first bank group (e.g., 431a.)

As discussed herein, the scheduler of controller 410 may issue commands that result in a plurality of rows of one or more memory banks 441-444 being open concurrently. Thus, controller 410 may include circuitry to associate indicators with a respective row address segments (ranges) of one or more banks. Circuitry of controller 410 may set the respective indicators to a first value that is associated with the respective row address segment of the first memory bank being unavailable (i.e., blocked) for opening a row in the associated respective row address range. A plurality of the respective indicators may be set to the first value in response to at least memory controller 410 processing a command to memory device 420 to open a row in the respective row address range of the memory bank 441-444 associated with at least one of the respective indicators. In other words, the opening of a row in one segment (e.g., 451*a*) in a bank 441 may cause other segments (e.g., 451*b*) to become unavailable (blocked).

Figure 5:
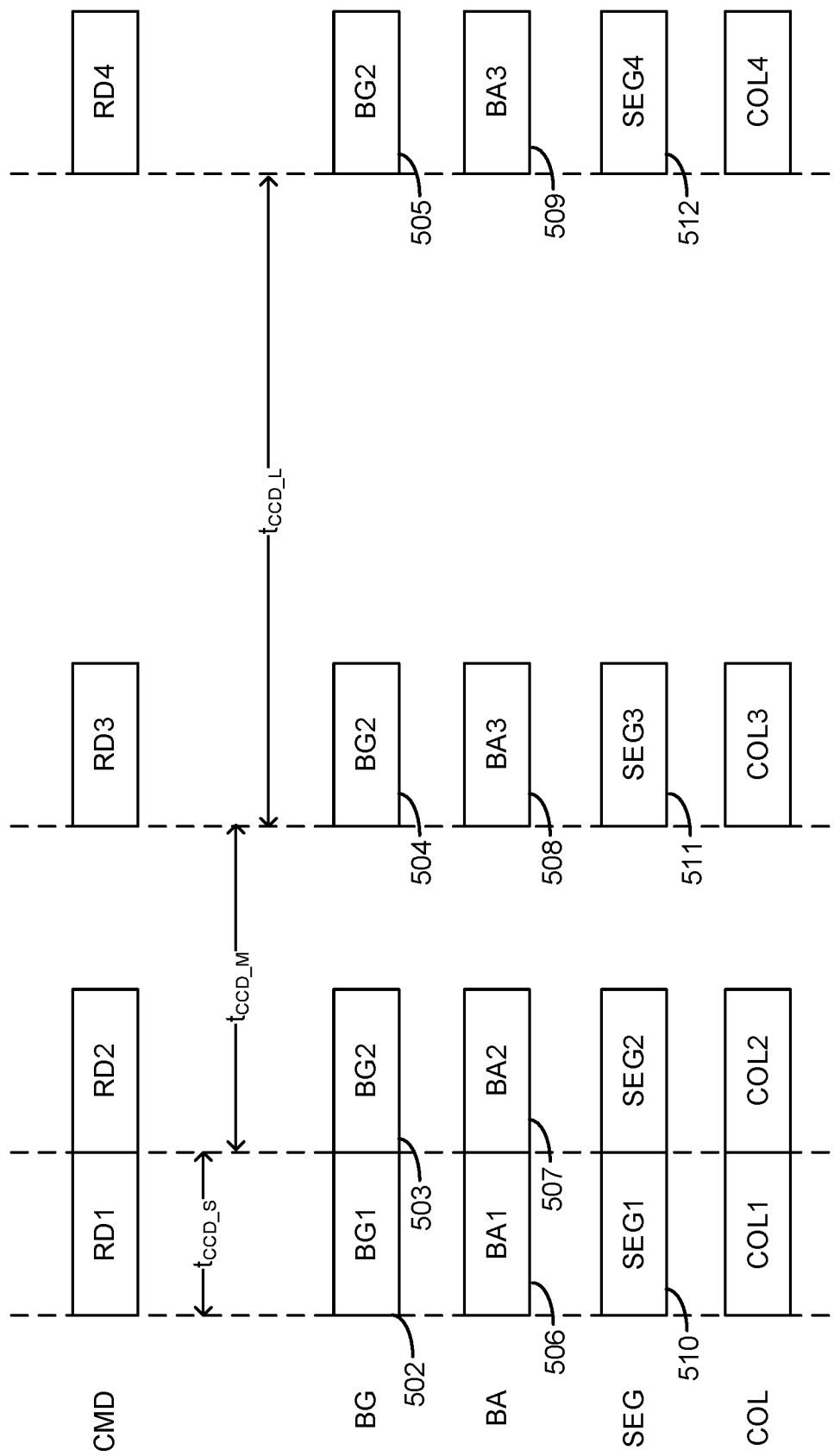
FIG. 5 is an illustration of multiple command to command delays.

FIG. 5 is an illustration of multiple command to command delays. In FIG. 5, column accesses are used as example commands for illustration purposes. However, other types of commands and delays (e.g., those detailed in Table 3) may follow a similar or equivalent pattern. A first example read command (RD1) is issued by controller 410 and received by memory component 420. The address associated with this command specifies the bank group address as BG1 502, the bank address as BA1 506, the segment address as SEG1 510, and the column address as COL2. If, for a subsequent command, a new bank group address is provided (e.g., BG2 where BG1≠BG2) the subsequent command may be issued/received in the shortest amount of time later (i.e., $t_{CCD\_S}$) or greater after the first command. This timing is illustrated in FIG. 5 by the $t_{CCD\_S}$ delay from the first read command (RD1) to the second read command (RD2) and the change in bank group address from BG1 502 to BG2 503. Note that as long as BG1≠BG2, there are no additional constraints on the subsequent bank (BA), segment (SEG), and/or column (COL) addresses in order to issue/receive the successive command in the shortest amount of time later (i.e., $t_{CCD\_S}$).

If, for a subsequent command (RD3) after the second command (RD2), the bank group address is the same as the second command, but a new bank address is provided (e.g., BA3≠BA2) the subsequent (RD3) command may be issued/received at the intermediate amount of time (i.e., $t_{CCD\_M}$) or greater after the first command. This timing is illustrated in FIG. 5 by the $t_{CCD\_M}$ delay from the second read command (RD2) to the third read command (RD3), the same bank group address BG2 503 and 504, and the change in bank address from BA2 507 to BA3 508. Note that when the bank group address is the same as the first command, and a new bank address is provided (e.g., BA3), there are no additional constraints on the segment (SEG), and/or column (COL) addresses in order to issue/receive the successive command in the intermediate amount of time later (i.e., $t_{CCD\_M}$).

If, for a subsequent command (RD4) after the third command (RD3), the bank group address and the bank address are the same as the first command, but a new segment address is provided (e.g., SEG4) the subsequent command may be issued/received the longest amount of time later (i.e., $t_{CCD\_L}$) or greater after the first command. This timing is illustrated in FIG. 5 by the $t_{CCD\_L}$ delay from the third read command (RD3) to the fourth read command (RD4), the same bank group address BG2 504 and 505, the same bank address BA3 508 and 509, and the change in the segment address from SEG3 511 to SEG4 512. Note that when the bank group address and the bank address are the same as the previous command, and a new segment address is provided (e.g., SEG4≠SEG3), there are no additional constraints on the column (COL) address in order to issue/receive the successive command in the longest amount of time later (i.e., $t_{CCD\_L}$). Table 4 summarizes the timing constraints described herein with reference to FIG. 5.

TABLE 4

| Command address | Next Command address | Timing Constraint |
| --- | --- | --- |
| BG1, BA1, and SEG1 | BG2 ≠ BG1, BA2, SEG2 | $t_{CCD\_S}$ |
| | BG2 = BG1, BA2 ≠ BA1, SEG2 | $t_{CCD\_M}$ |
| | BG2 = BG1, BA2 = BA1, SEG2 | $t_{CCD\_L}$ |

It should be understood that the foregoing description assumes $t_{CCD\_L}$ applies for both subsequent accesses to different columns within the same bank group, same bank address, and same segment, and for subsequent accesses to different segments within the same bank group and same bank address. In an embodiment, different timings may apply for accesses to different columns within the same bank group, same bank address, and same segment, and for subsequent accesses to different segments within the same bank address.

In an embodiment, the scheduling logic of controller 410, and/or memory component 420, may be configured (e.g., by registers or commands) to use the longest timings for all back-to-back accesses. When in this mode, the scheduling performed by controller 410, and the internal timings of memory device 120, are simplified. However, when in the hierarchical (i.e., segment/bank/bank group) mode described herein with reference to FIGS. 4-5, the better optimized multi-level timings may be used based on the accesses.

Figure 6A:
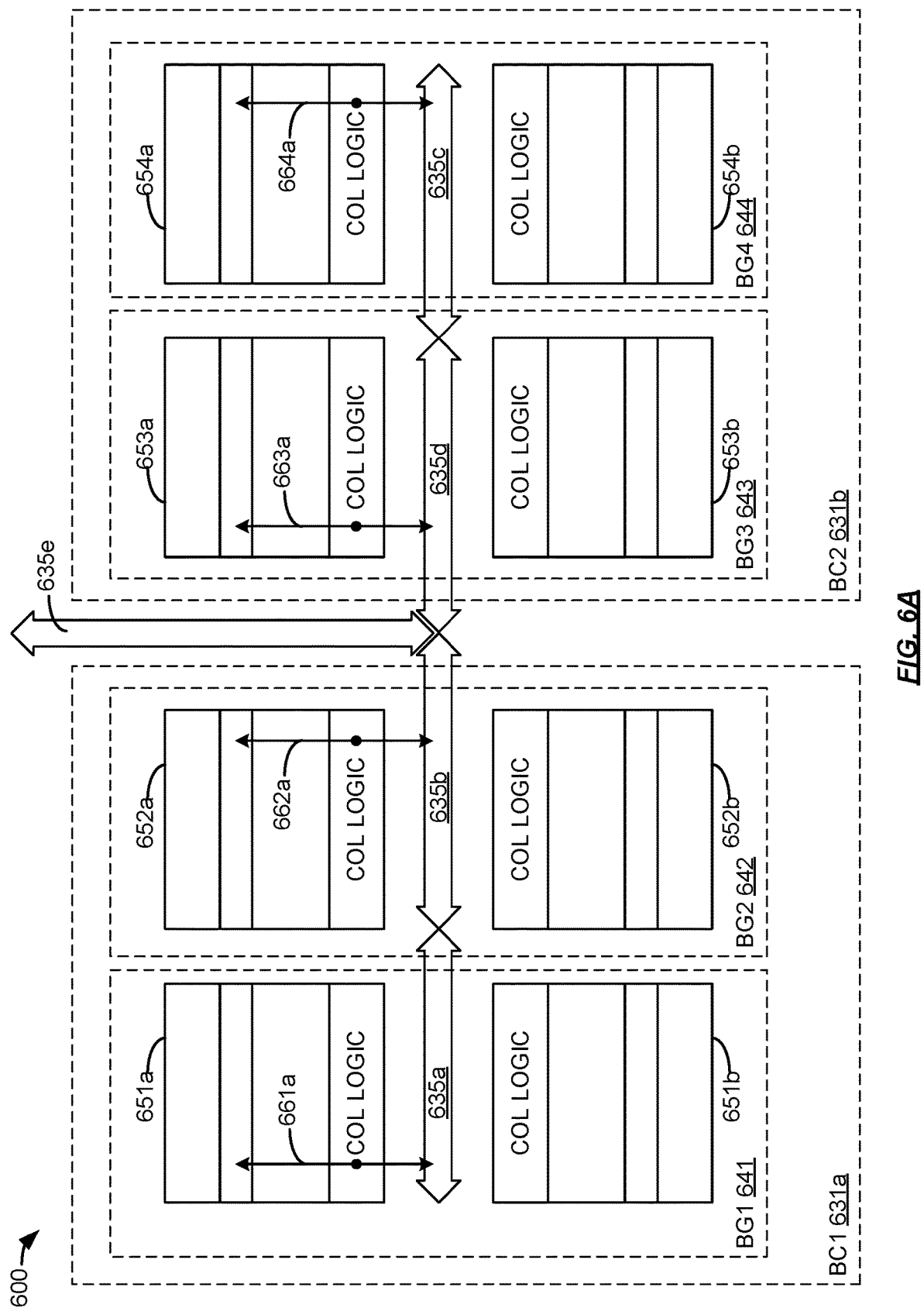
FIG. 6A is an illustration of a first example of signal paths for bank group cluster accesses.

FIG. 6A is an illustration of a first example of signal paths for bank group cluster accesses. In FIG. 6A, memory component 600 includes bank group cluster #1 (BC1) 631*a* and bank group cluster #2 (BC2) 631*b*. BC1 631*a* includes bank group #1 (BG1) 641 and bank group #2 (BG2) 642. BC2 631*b* includes bank group #3 (BG3) 643 and bank group #4 (BG4) 644. BG1 includes memory bank 651*a* and memory bank 651*b*. BG2 includes memory bank 652*a* and memory bank 652*b*. BG3 includes memory bank 653*a* and memory bank 653*b*. BG4 includes memory bank 654*a* and memory bank 654*b*.

Bank 651*a* and bank 651*b* are operatively coupled to datapath circuitry 635*a* (e.g., MUX/DEMUX functions, buffers, common signal lines, logic, etc.) Bank 652*a* and bank 652*b* are operatively coupled to datapath circuitry 635*b*. Datapath circuitry 635*a* is operatively coupled to datapath circuitry 635*b*. Bank 654*a* and bank 654*b* are operatively coupled to datapath circuitry 635*c*. Bank 653*a* and bank 653*b* are operatively coupled to datapath circuitry 635*d*. Datapath circuitry 635*c* is operatively coupled to datapath circuitry 635*d*. Datapath circuitry 635*b* and datapath circuitry 635*d* are operatively coupled to datapath circuitry 635*e*. Thus, to access a row in either bank 651*a* or 651*b*, data flows via datapath circuitry 635*a*, 635*b*, and 635*e*. Likewise, to access a row in either of bank 654*a* or 654*b*, data flows via datapath circuitry 635*c*, 635*d*, and 635*e*. To access a row in either of bank 652*a* or 652*b*, data flows via datapath circuitry 635*b*, and 635*e*. To access a row in either of bank 653*a* or 653*b*, data flows via datapath circuitry 635*d*, and 635*e*.

The datapath circuitry 635*a* shared by bank 651*a* and bank 651*b* may run at a frequency governed by the core column to column delay timing (e.g., $t_{CCD\_L}$=5-10 ns for a 100-200 MHz cycle frequency.) Likewise, the datapath circuitry 635c shared by bank 654a and bank 654b may run at a frequency governed by the core column to column delay timing (e.g., $t_{CCD\_L}$=5-10 ns for a 100-200 MHz cycle frequency.) The datapath circuitry 635b shared by bank 652a, bank 652b, and datapath 635a may run at a frequency governed by the intermediate column to column delay timing (e.g., $t_{CCD\_M}$=2.5-5 ns for a 200-400 MHz cycle frequency.) Likewise, the datapath circuitry 635d shared by bank 653a, bank 653b, and datapath 635c may run at a frequency governed by the intermediate column to column delay timing (e.g., $t_{CCD\_M}$=2.5-5 ns for a 200-400 MHz cycle frequency.) Finally, the datapath circuitry 635e which carries data for all of the banks 651a, 651b, 652a, 652b, 653a, 653b, 654a, and 654b may run at a frequency governed by the shortest column to column delay timing (e.g., $t_{CCD\_S}$=1.25-2.5 ns for a 400-800 MHz cycle frequency.)

In example access operation, four units (e.g., byte, word, etc.) of data are transferred in to, or out of, a respectively addressed row in a respective bank 651a-654a. This is illustrated in FIG. 6A by lines 661a-664a. A first unit of data is transferred between a row in bank 651a via datapath 661a and 635a. Similarly, a second unit of data is transferred between a row in bank 654a via datapath 664a and 635c. The first unit of data is time multiplexed with a third unit of data to/from a row in bank 652a on datapath 635b. The second unit of data is time multiplexed with a fourth unit of data to/from a row in bank 653a on datapath 635d. All four units of data are time multiplexed on datapath 635e. Datapath 635e may operatively couple to input/output logic for memory component 600. The multiplexing of data to/from banks 651a-654a is further described by way of example in FIG. 6B.

Figure 6B:
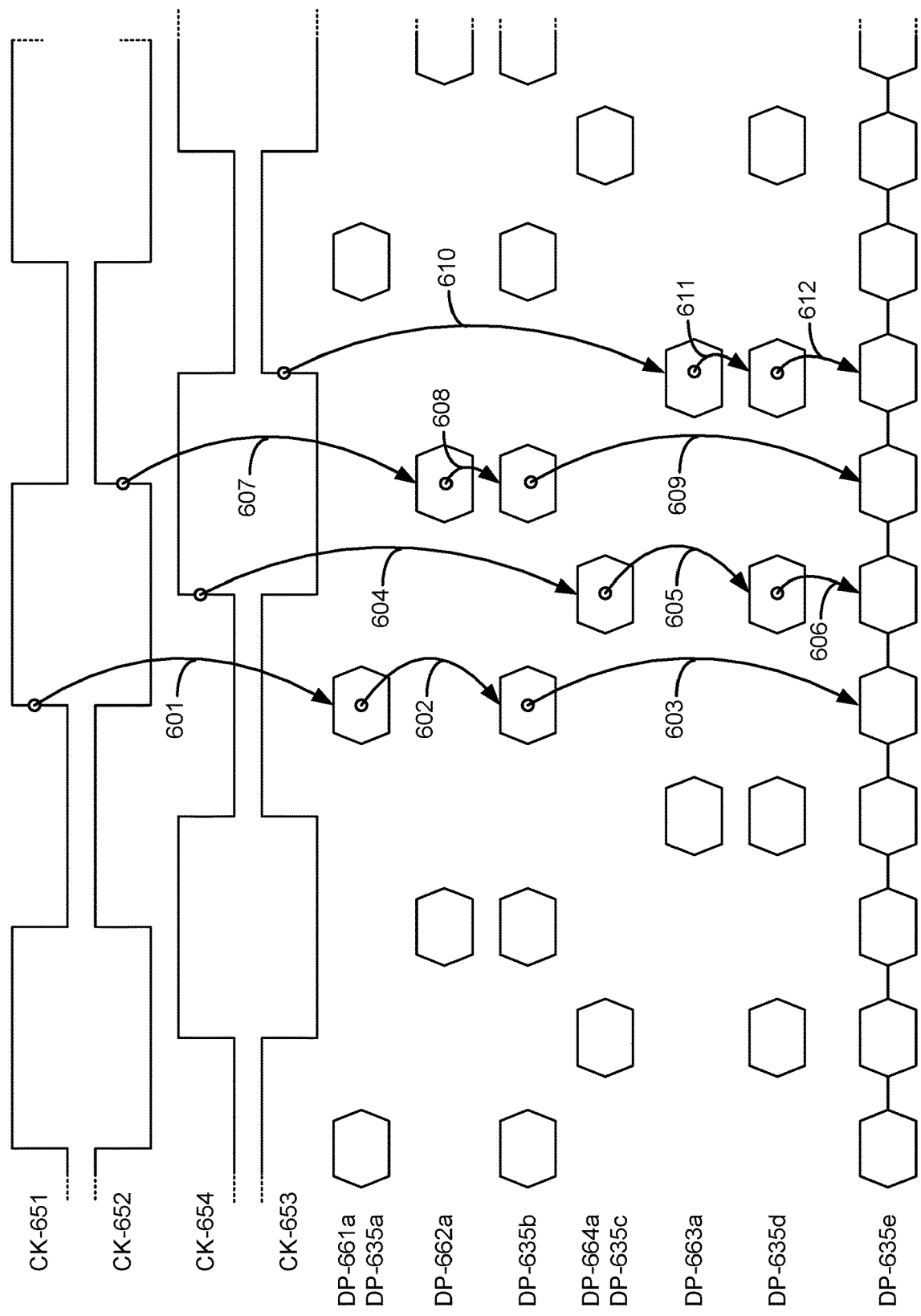
FIG. 6B is a timing diagram illustrating a bank group cluster access.

FIG. 6B is a timing diagram illustrating a bank group cluster access. In FIG. 6B, banks 651a-654a are being clocked by the signals CK-651 to CK-654, respectively. CK-652 is delayed by 180° from CK-651. CK-653 is delayed by 270° from CK-651. CK-654 is delayed by 90° from CK-651.

On a rising edge of CK-651, a first unit of data is read out of bank 651a via datapath 661a and carried via datapath 635a. This is illustrated by arrow 601. Datapath 635a couples the first unit of data to datapath 635b. This is illustrated by arrow 602. Datapath 635b couples the first unit of data to datapath 635e. This is illustrated by arrow 603.

On the next rising edge of CK-654 a second unit of data is read out of bank 654a via datapath 664a and carried via datapath 635c. This is illustrated by arrow 604. Datapath 635c couples the second unit of data to datapath 635d. This is illustrated by arrow 605. Datapath 635d couples the second unit of data to datapath 635e. This is illustrated by arrow 606.

On the next rising edge of CK-652 a third unit of data is read out of bank 652a via datapath 662a. This is illustrated by arrow 607. Datapath 662a couples the third unit of data to datapath 635b. This is illustrated by arrow 608. Datapath 635b couples the third unit of data to datapath 635e. This is illustrated by arrow 609.

On the next rising edge of CK-653 a fourth unit of data is read out of bank 653a via datapath 663a. This is illustrated by arrow 610. Datapath 663a couples the fourth unit of data to datapath 635d. This is illustrated by arrow 611. Datapath 635d couples the fourth unit of data to datapath 635e. This is illustrated by arrow 612.

Figure 7A:
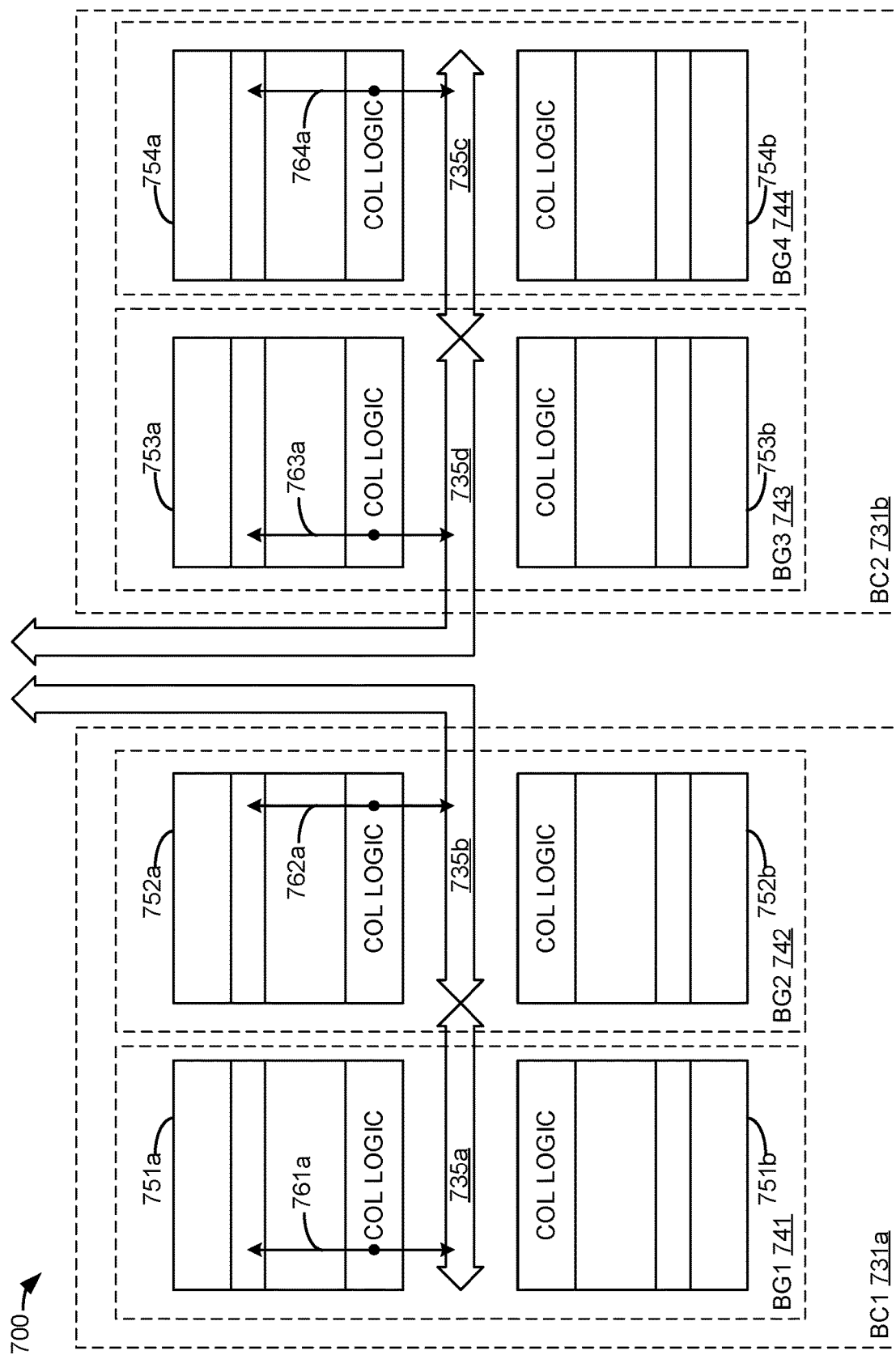
FIG. 7A is an illustration of a second example of signal paths for bank group cluster accesses.

FIG. 7A is an illustration of a second example of signal paths for bank group cluster accesses. In FIG. 7A, memory component 700 include bank group cluster #1 (BC1) 731a and bank group cluster #2 (BC2) 731b. BC1 731a includes bank group #1 (BG1) 741 and bank group #2 (BG2) 742. BC2 731b includes bank group #3 (BG3) 743 and bank group #4 (BG4) 744. BG1 741 includes memory bank 751a and memory bank 751b. BG2 742 includes memory bank 752a and memory bank 752b. BG3 743 includes memory bank 753a and memory bank 753b. BG4 744 includes memory bank 754a and memory bank 754b.

Bank 751a and bank 751b are operatively coupled to datapath circuitry 735a (e.g., MUX/DEMUX functions, buffers, common signal lines, logic, etc.) Bank 752a and bank 752b are operatively coupled to datapath circuitry 735b. Datapath circuitry 735a is operatively coupled to datapath circuitry 735b. Bank 754a and bank 754b are operatively coupled to datapath circuitry 735c. Bank 753a and bank 753b are operatively coupled to datapath circuitry 735d. Datapath circuitry 735c is operatively coupled to datapath circuitry 735d. Thus, to access a row in either bank 751a or 751b, data flows via datapath circuitry 735a and 735b. Likewise, to access a row in either of bank 754a or 754b, data flows via datapath circuitry 735c and 735d. To access a row in either of bank 752a or 752b, data flows via datapath circuitry 735b. To access a row in either of bank 753a or 753b, data flows via datapath circuitry 735d.

The datapath circuitry 735a shared by bank 751a and bank 751b may run at a frequency governed by the core column to column delay timing (e.g., $t_{CCD\_L}$=5-10 ns for a 100-200 MHz cycle frequency.) Likewise, the datapath circuitry 735c shared by bank 754a and bank 754b may run at a frequency governed by the core column to column delay timing (e.g., $t_{CCD\_L}$=5-10 ns for a 100-200 MHz cycle frequency.) The datapath circuitry 735b shared by bank 752a, bank 752b, and datapath 735a may run at a frequency governed by the intermediate column to column delay timing (e.g., $t_{CCD\_M}$=2.5-5 ns for a 200-400 MHz cycle frequency.) Likewise, the datapath circuitry 735d shared by bank 753a, bank 753b, and datapath 735c may run at a frequency governed by the intermediate column to column delay timing (e.g., $t_{CCD\_M}$=2.5-5 ns for a 200-400 MHz cycle frequency.)

In example access operation, four units (e.g., byte, word, etc.) of data are transferred in to, or out of, a respectively addressed row in a respective bank 751a-754a. This is illustrated in FIG. 7A by lines 761a-764a. A first unit of data is transferred between a row in bank 751a via datapath 761a and 735a. Similarly, a second unit of data is transferred between a row in bank 754a via datapath 764a and 735c. The first unit of data is time multiplexed with a third unit of data to/from a row in bank 752a on datapath 735b. The second unit of data is time multiplexed with a fourth unit of data to/from a row in bank 753a on datapath 735d. Datapaths 735b and 735d may operatively couple to input/output logic for memory component 700. The multiplexing of data to/from banks 751a-754a is further described by way of example in FIG. 7B.

Figure 7B:
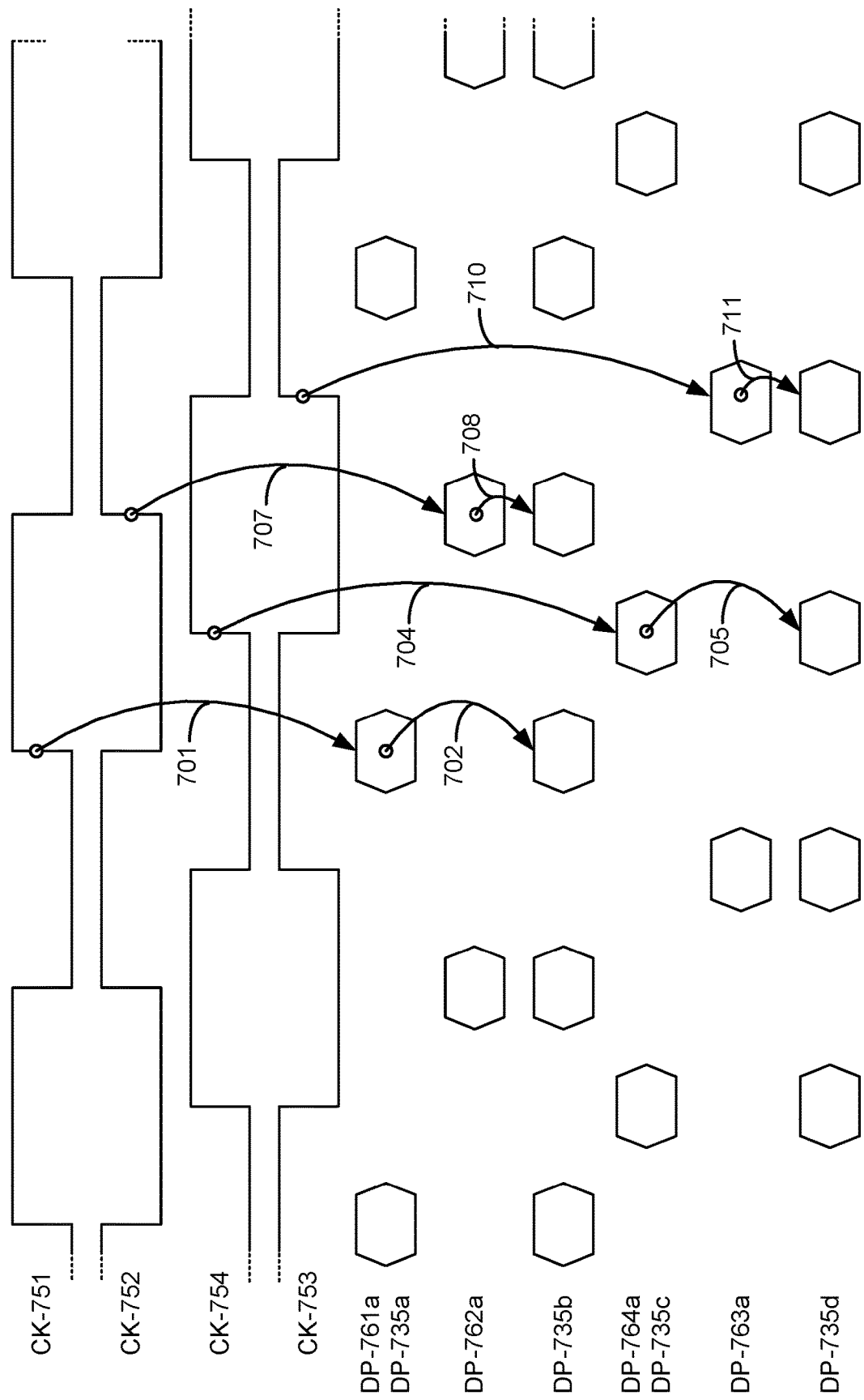
FIG. 7B is a timing diagram illustrating a bank group cluster access.

FIG. 7B is a timing diagram illustrating a bank group cluster access. In FIG. 7B, banks 751a-754a are being clocked by the signals CK-751 to CK-754, respectively. CK-752 is delayed by 180° from CK-751. CK-753 is delayed by 270° from CK-751. CK-754 is delayed by 90° from CK-751.

On a rising edge of CK-751, a first unit of data is read out of bank 751a via datapath 761a and carried via datapath 735a. This is illustrated by arrow 701. Datapath 735a couples the first unit of data to datapath 735b. This is illustrated by arrow 702.

On the next rising edge of CK-754 a second unit of data is read out of bank 754a via datapath 764a and carried via datapath 735c. This is illustrated by arrow 704. Datapath 735c couples the second unit of data to datapath 735d. This is illustrated by arrow 705.

On the next rising edge of CK-752 a third unit of data is read out of bank 752a via datapath 762a. This is illustrated by arrow 707. Datapath 762a couples the third unit of data to datapath 735b. This is illustrated by arrow 708.

On the next rising edge of CK-753 a fourth unit of data is read out of bank 753a via datapath 763a. This is illustrated by arrow 710. Datapath 763a couples the fourth unit of data to datapath 735d. This is illustrated by arrow 711.

It should be understood that the data carried by datapath 735b and datapath 735d may be further time-multiplexed together by additional circuitry not shown in FIG. 7A (e.g., data I/O circuitry such as data interface 124). This time-multiplexing may result in a column to column delay visible to a memory controller that is governed by $t_{CCD\_S}$.

Figure 8A:
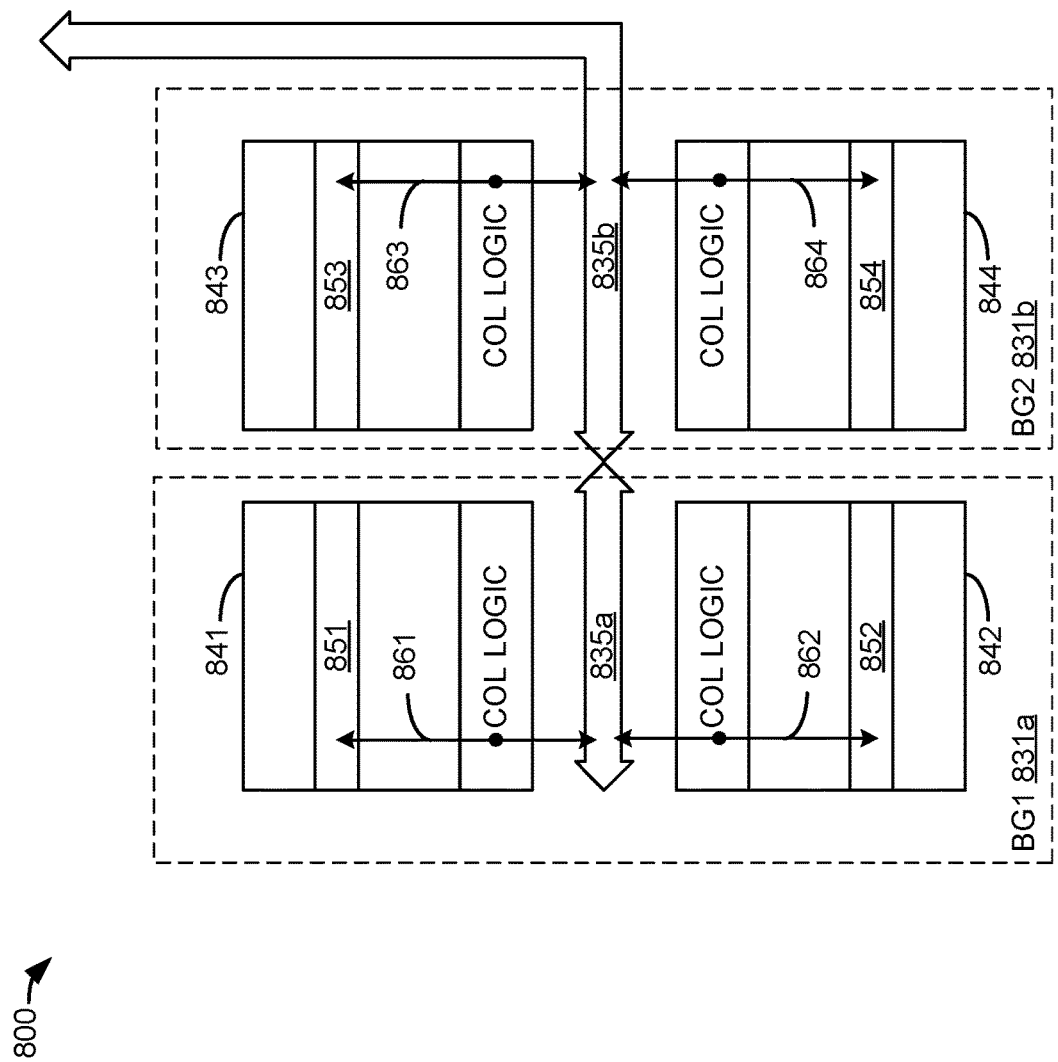
FIG. 8A is an illustration of a first example of signal paths for bank group accesses.

FIG. 8A is an illustration of a first example of signal paths for bank group accesses. In FIG. 8A, memory component 800 includes bank group #1 (BG1) 831a and bank group #2 (BG2) 831b. BG1 831a includes memory bank 841 and memory bank 842. BG2 831b includes memory bank 843 and memory bank 844. Memory bank 841 includes (non-blocked) segment 851. Memory bank 842 includes (non-blocked) segment 852. Memory bank 843 includes (non-blocked) segment 853. Memory bank 844 includes (non-blocked) segment 854.

Bank 841 and bank 842 are operatively coupled to datapath circuitry 835a (e.g., MUX/DEMUX functions, buffers, common signal lines, logic, etc.) Bank 843 and bank 844 are operatively coupled to datapath circuitry 835b. Datapath circuitry 835a is operatively coupled to datapath circuitry 835b. Thus, to access a row in either bank 841 or 842, data flows via datapath circuitry 835a and 835b. Likewise, to access a row in either of bank 843 or 844, data flows via datapath circuitry 835b.

The row access datapaths 861-864 may run at a frequency governed by the core column to column delay timing (e.g., $t_{CCD\_L}$=5-10 ns for a 100-200 MHz cycle frequency.) The datapath circuitry 835a shared by bank 841 and bank 842 may run at a frequency governed by the intermediate column to column delay timing (e.g., $t_{CCD\_M}$=2.5-5 ns for a 200-400 MHz cycle frequency.) The datapath circuitry 835b shared by bank 843, bank 844, and datapath 835a may run at a frequency governed by the shortest column to column delay timing (e.g., $t_{CCD\_S}$=1.25-2.5 ns for a 400-800 MHz cycle frequency.)

In example access operation, four units (e.g., byte, word, etc.) of data are transferred in to, or out of, a respectively addressed row in a respective bank 841-844. This is illustrated in FIG. 8A by lines 861-864. A first unit of data is transferred between a row in segment 851 via datapath 861 and 835a. A second unit of data is transferred between a row in segment 853 via datapath 835b. The first unit of data is time multiplexed with the second unit of data on datapath 835b. A third unit of data is transferred between a row in segment 852 via datapath 862 and 835a. The third unit of data is time multiplexed with the first unit of data on datapath 835a. The third unit of data is time multiplexed with the first and second units of data on datapath 835b. A fourth unit of data is transferred between a row in segment 854 via datapath 864. The fourth unit of data is time multiplexed with the first, second, and third units of data on datapath 835b. Thus, all four units of data are time multiplexed on datapath 835b. Datapath 835b may operatively couple to input/output logic for memory component 800. The multiplexing of data to/from segments 851-854 is further described by way of example in FIG. 8B.

Figure 8B:
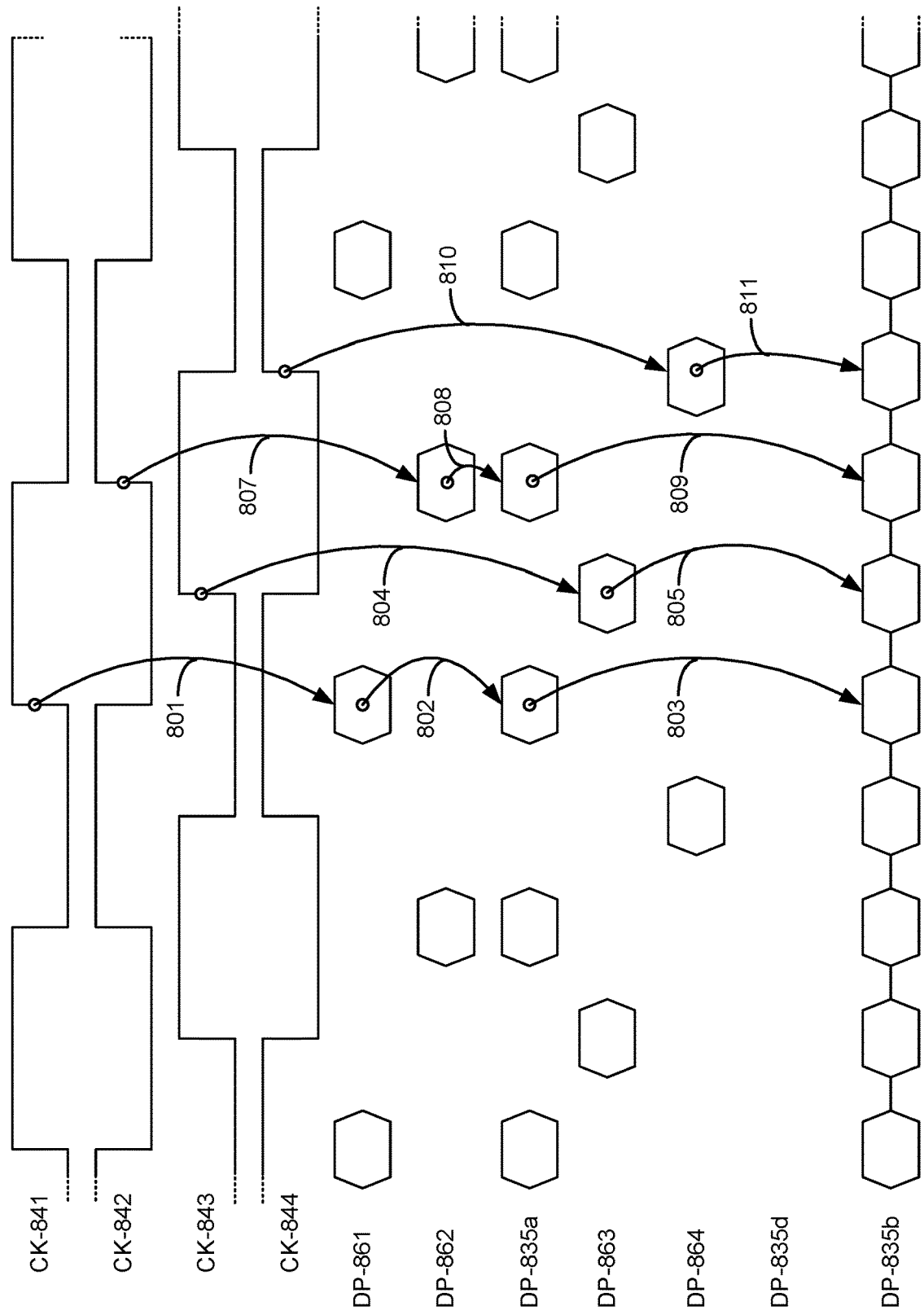
FIG. 8B is a timing diagram illustrating a bank group access.

FIG. 8B is a timing diagram illustrating a bank group access. In FIG. 8B, banks 841-844 are being clocked by the signals CK-841 to CK-844, respectively. CK-842 is delayed by 180° from CK-841. CK-843 is delayed by 90° from CK-841. CK-844 is delayed by 270° from CK-841.

On a rising edge of CK-841, a first unit of data is read out of segment 851 via datapath 861 and carried via datapath 835a. This is illustrated by arrows 801 and 802, respectively. Datapath 835a couples the first unit of data to datapath 835b. This is illustrated by arrow 803.

On the next rising edge of CK-843 a second unit of data is read out of segment 853 via datapath 863 and carried via datapath 835b. This is illustrated by arrows 804 and 805, respectively.

On the next rising edge of CK-842, a third unit of data is read out of segment 852 via datapath 862 and carried via datapath 835a. This is illustrated by arrows 807 and 808, respectively. Datapath 835a couples the third unit of data to datapath 835b. This is illustrated by arrow 809.

On the next rising edge of CK-844, a fourth unit of data is read out of segment 854 via datapath 864 and carried via datapath 835b. This is illustrated by arrows 810 and 811, respectively.

Figure 9A:
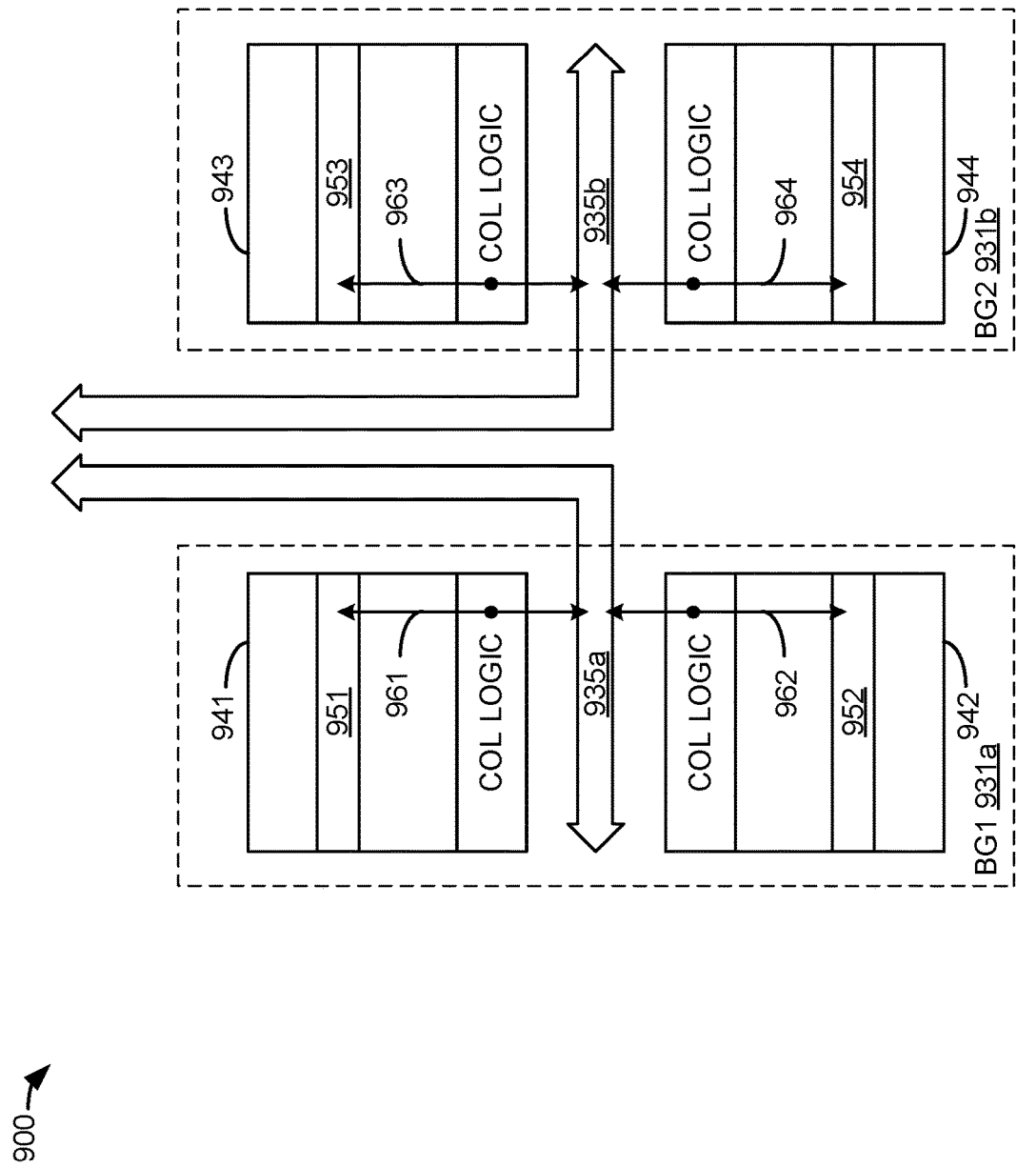
FIG. 9A is an illustration of a second example of signal paths for bank group accesses.

FIG. 9A is an illustration of a second example of signal paths for bank group accesses. In FIG. 9A, memory component 900 includes bank group #1 (BG1) 931a and bank group #2 (BG2) 931b. BG1 931a includes memory bank 941 and memory bank 942. BG2 931b includes memory bank 943 and memory bank 944. Memory bank 941 includes (non-blocked) segment 951. Memory bank 942 includes (non-blocked) segment 952. Memory bank 943 includes (non-blocked) segment 953. Memory bank 944 includes (non-blocked) segment 954.

Bank 941 and bank 942 are operatively coupled to datapath circuitry 935a (e.g., MUX/DEMUX functions, buffers, common signal lines, logic, etc.) Bank 943 and bank 944 are operatively coupled to datapath circuitry 935b. Thus, to access a row in either bank 941 or 942, data flows via datapath circuitry 935a. Likewise, to access a row in either of bank 943 or 944, data flows via datapath circuitry 935b.

The datapath circuitry 961-964 to access a respective row in segments 951-954 may run at a frequency governed by the core column to column delay timing (e.g., $t_{CCD\_L}$=5-10 ns for a 100-200 MHz cycle frequency.) The datapath circuitry 935a shared by bank 941 and bank 942 may run at a frequency governed by the intermediate core column to column delay timing (e.g., $t_{CCD\_M}$=2.5-5 ns for a 200-400 MHz cycle frequency.) The datapath circuitry 935b shared by bank 943, bank 944, and datapath 935a may run at a frequency governed by the shortest column to column delay timing (e.g., $t_{CCP\_S}$=1.25-2.5 ns for a 400-800 MHz cycle frequency.)

In example access operation, four units (e.g., byte, word, etc.) of data are transferred in to, or out of, a respectively addressed row in a respective bank 941-944. This is illustrated in FIG. 9A by lines 961-964. A first unit of data is transferred between a row in segment 951 via datapath 961 and 935a. A second unit of data is transferred between a row in segment 953 via datapath 935b. A third unit of data is transferred between a row in segment 952 via datapath 962 and 935a. The third unit of data is time multiplexed with the first unit of data on datapath 935a. A fourth unit of data is transferred between a row in segment 954 via datapath 964. The fourth unit of data is time multiplexed with the second units of data on datapath 935b. Datapaths 935a and 935b may operatively couple to input/output logic for memory component 900. The multiplexing of data to/from segments 951-954 is further described by way of example in FIG. 9B.

Figure 9B:
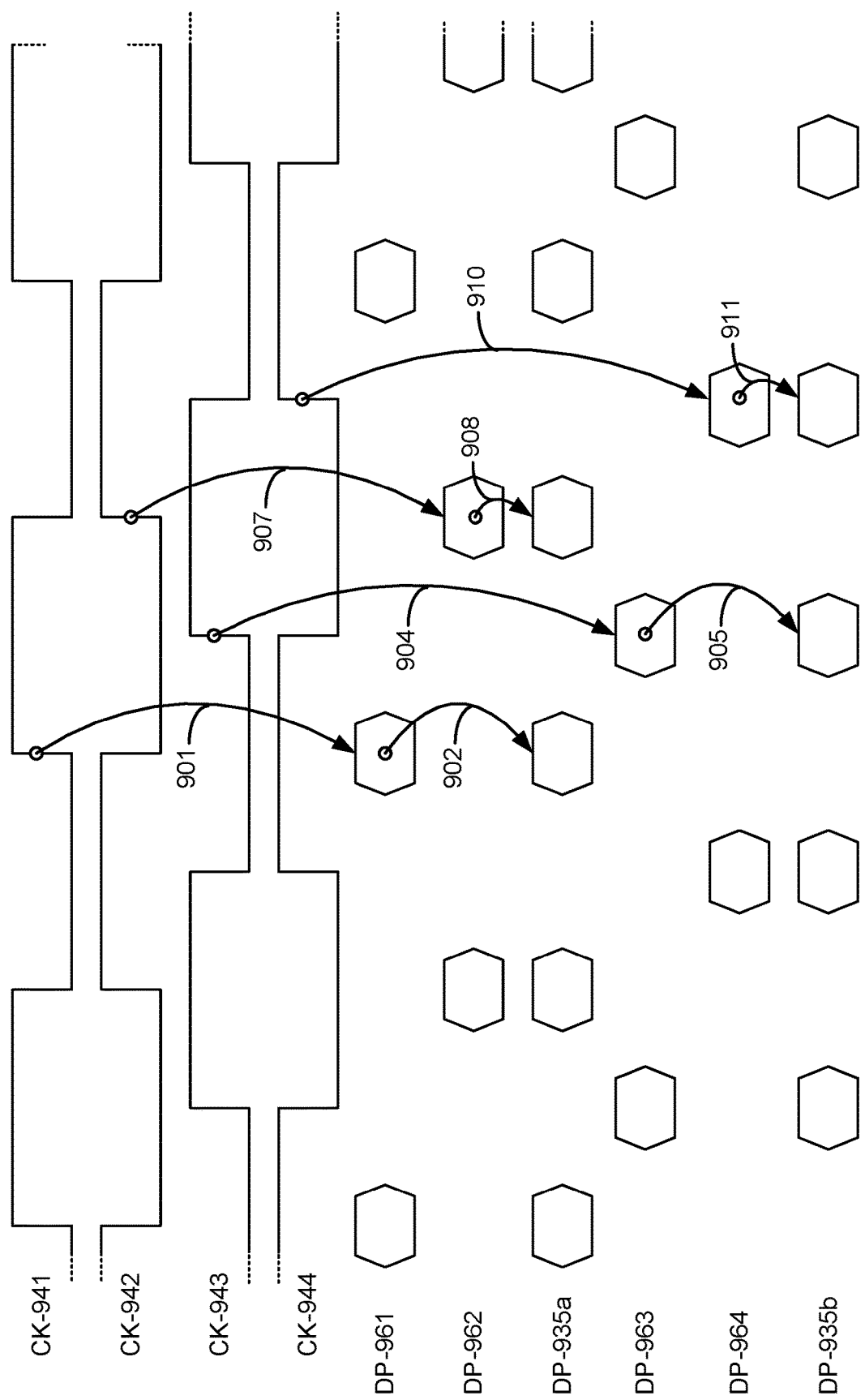
FIG. 9B is a timing diagram illustrating a bank group access.

FIG. 9B is a timing diagram illustrating a bank group access. In FIG. 9B, banks 941-944 are being clocked by the signals CK-941 to CK-944, respectively. CK-942 is delayed by 180° from CK-941. CK-943 is delayed by 90° from CK-941. CK-944 is delayed by 270° from CK-941.

On a rising edge of CK-941, a first unit of data is read out of segment 951 via datapath 961 and carried via datapath 935a. This is illustrated by arrows 901 and 902, respectively. On the next rising edge of CK-943 a second unit of data is read out of segment 953 via datapath 963 and carried via datapath 935b. This is illustrated by arrows 904 and 905, respectively. On the next rising edge of CK-942, a third unit of data is read out of segment 952 via datapath 962 and carried via datapath 935a. This is illustrated by arrows 907 and 908, respectively. On the next rising edge of CK-944, a fourth unit of data is read out of segment 954 via datapath 964 and carried via datapath 935b. This is illustrated by arrows 910 and 911, respectively.

It should be understood that the data carried by datapath 935a and datapath 935b may be further time-multiplexed together by additional circuitry not shown in FIG. 9A (e.g., data I/O circuitry such as data interface 424). This time-multiplexing may result in a column to column delay visible to a memory controller that is governed by $t_{CCD\_S}$.

Figure 10:
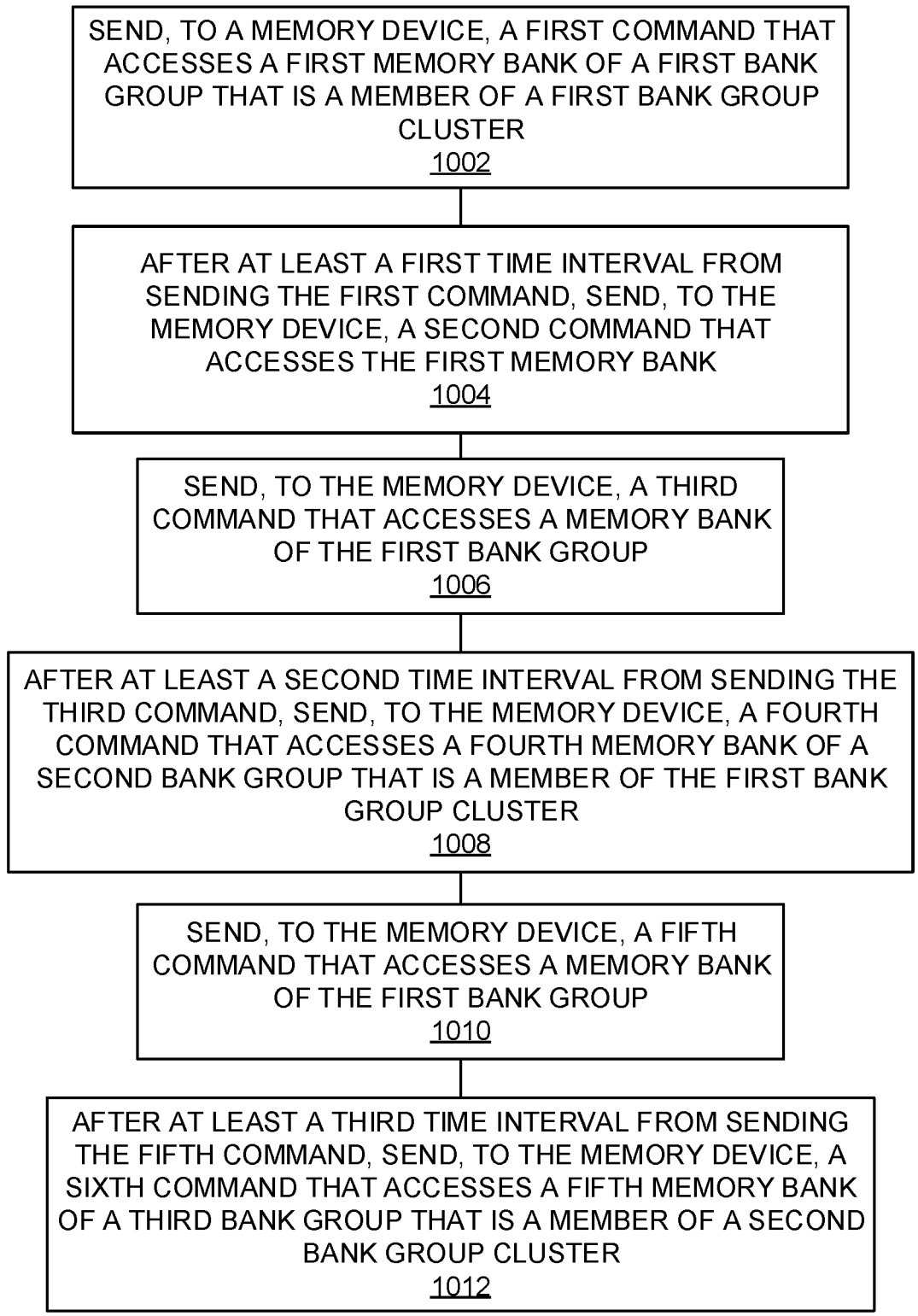
FIG. 10 is a flowchart illustrating a method of operating a memory device with hierarchical bank group timing.

FIG. 10 is a flowchart illustrating a method of operating a memory device with hierarchical bank group timing. The steps illustrated in FIG. 10 may be performed by system 100, and/or its components. To a memory device, a first command is sent that accesses a first memory bank of a first bank group that is a member of a first bank group cluster (1002). For example, controller 110 may send a command to memory component 120 that accesses bank 151a of bank group 141, which is a member of bank group cluster 131a.

After at least a first time interval from sending the first command, a second command is sent to the memory device that accesses the first memory bank (1004). For example, after $t_{CCD\_L}$ has elapsed from sending the first command that accesses bank 151a, controller 110 may send, to memory component 120, a second command that accesses bank 151a.

A third command is sent to the memory device that accesses a memory bank of the first bank group (1006). For example, controller 110 may send a command to memory component 120 that accesses bank 151c of bank group 141, which is a member of bank group cluster 131a.

After at least a second time interval from sending the third command, a fourth command is sent to the memory device that accesses a fourth memory bank of a second bank group that is a member of the first bank group cluster (1008). For example, after $t_{CCD\_M}$ has elapsed from sending the third command that accesses memory bank 151c of the first bank group 141, controller 110 may send to memory component 120 a fourth command that accesses bank 152a of bank group 142, which is a member of bank group cluster 131a.

A fifth command is sent to the memory device that accesses a memory bank of the first bank group (1010). For example, controller 110 may send a command to memory component 120 that accesses bank 151a of bank group 141, which is a member of bank group cluster 131a. After at least a third time interval from sending the fifth command, a sixth command is sent to the memory device that accesses a fifth memory bank of a third bank group that is a member of a second bank group cluster (1012). For example, after $t_{CCD\_S}$ has elapsed from sending the fifth command that accesses bank 151a of bank group 141, which is a member of bank group cluster 131a, controller 110 may send to memory component 120 a sixth command that accesses bank 153a of bank group 143, which is a member of bank group cluster 131b.

Figure 11:
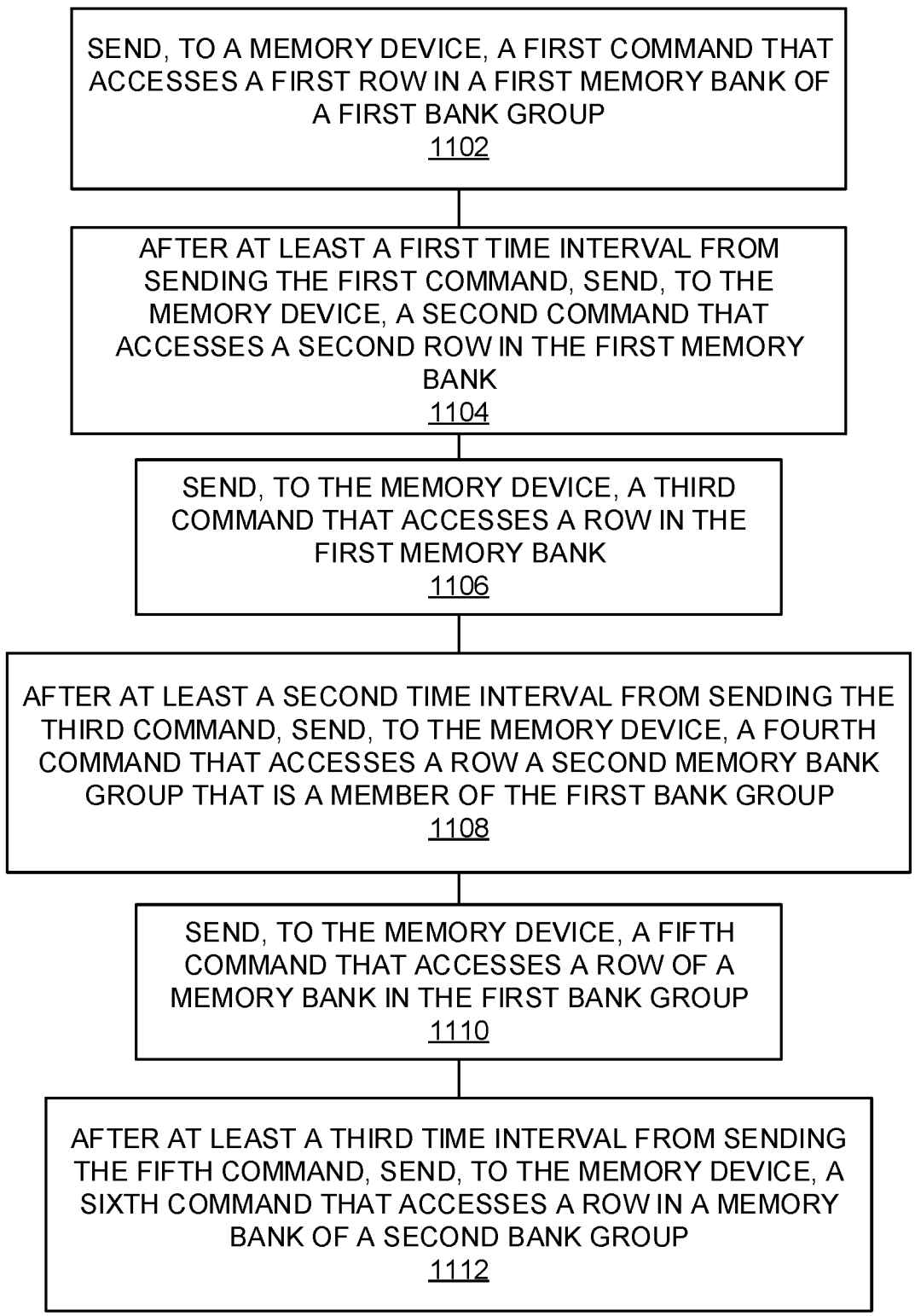
FIG. 11 is a flowchart illustrating a method of operating a memory device.

FIG. 11 is a flowchart illustrating a method of operating a memory device. The steps illustrated in FIG. 11 may be performed by system 100, and/or its components. To a memory device, a first command is sent that accesses a first row in a first memory bank that is a member of a first bank group (1102). For example, controller 410 may send a command to memory component 420 that accesses a row in segment 451a of bank 441, which is a member of bank group 431a.

After at least a first time interval from sending the first command, a second command is sent to the memory device that accesses a second row in the first memory bank (1104). For example, after $t_{CCD\_L}$ has elapsed from sending the first command that accesses a row in segment 451a of bank 441, controller 410 may send, to memory component 420, a second command that accesses a row in segment 451b of bank 441.

A third command is sent to the memory device that accesses a row in the first memory bank (1106). For example, controller 410 may send a command to memory component 420 that accesses a row in segment 451a of memory bank 441.

After at least a second time interval from sending the third command, a fourth command is sent to the memory device that accesses a row of a second memory bank that is a member of the first bank group (1108). For example, after $t_{CCD\_M}$ has elapsed from sending the third command that accesses that accesses a row in segment 451a of memory bank 441, controller 410 may send to memory component 420 a fourth command that accesses a row in segment 452a of memory bank 442, which is a member of bank group 431a.

A fifth command is sent to the memory device that accesses a row of a memory bank in the first bank group (1110). For example, controller 410 may send a command to memory component 420 that accesses a row in segment bank 451a of memory bank group 441, which is a member of bank group 431a. After at least a third time interval from sending the fifth command, a sixth command is sent to the memory device that accesses a row in a memory bank of a second bank group (1112). For example, after $t_{CCD\_S}$ has elapsed from sending the fifth command that accesses a row in segment bank 451a of memory bank group 441, which is a member of bank group cluster 431a, controller 410 may send to memory component 420 a sixth command that accesses a row in segment 453a of memory bank 443, which is a member of bank group 431b.

The methods, systems and devices described above may be implemented in computer systems or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory 300, memory system 400, memory component 600, memory component 700, memory component 800, memory component 900, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 12:
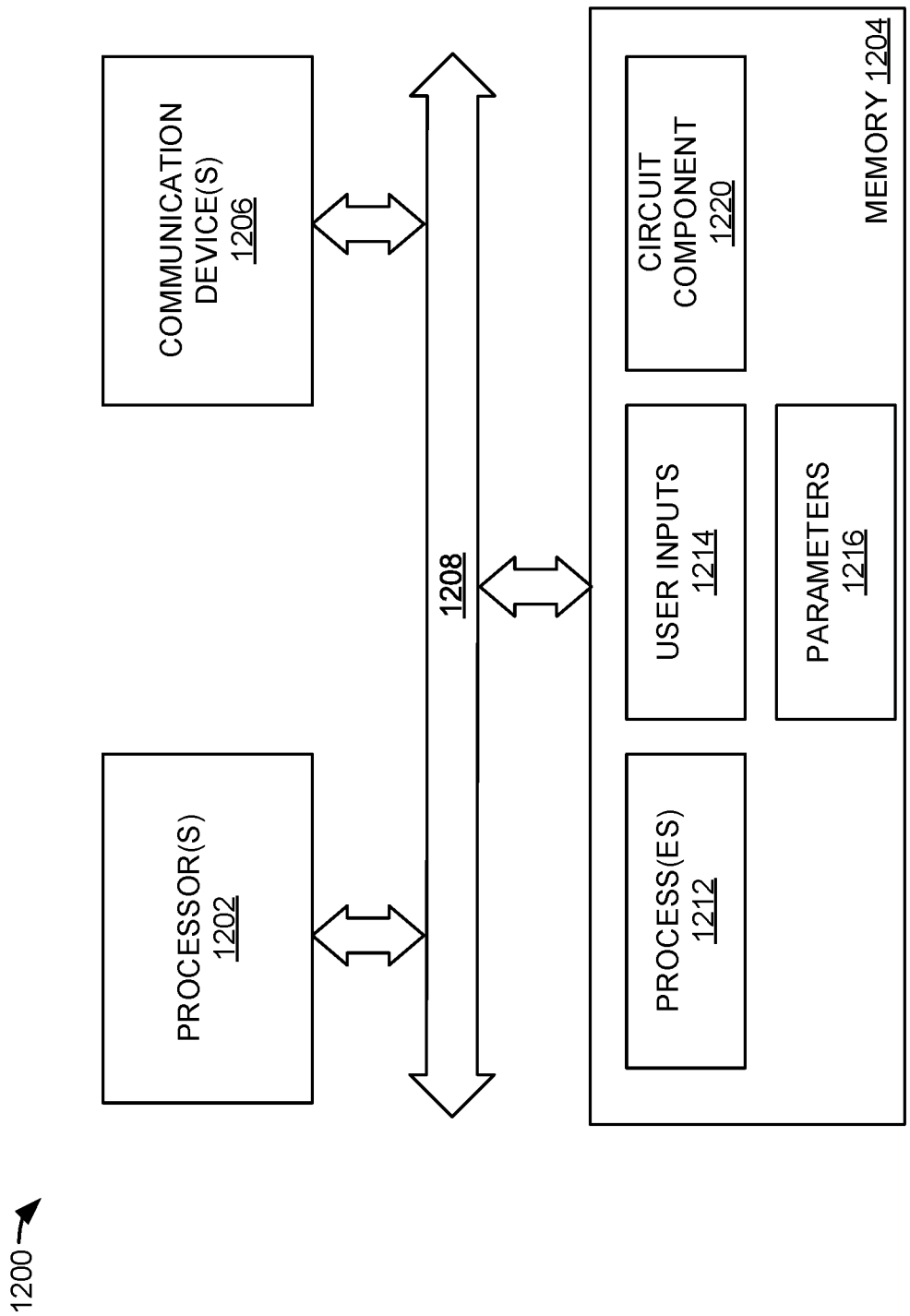
FIG. 12 is a block diagram of a processing system.

FIG. 12 is a block diagram illustrating one embodiment of a processing system 1200 for including, processing, or generating, a representation of a circuit component 1220. Processing system 1200 includes one or more processors 1202, a memory 1204, and one or more communications devices 1206. Processors 1202, memory 1204, and communications devices 1206 communicate using any suitable type, number, and/or configuration of wired and/or wireless connections 1208.

Processors 1202 execute instructions of one or more processes 1212 stored in a memory 1204 to process and/or generate circuit component 1220 responsive to user inputs 1214 and parameters 1216. Processes 1212 may be any suitable electronic design automation (EDA) tool or portion thereof used to design, simulate, analyze, and/or verify electronic circuitry and/or generate photomasks for electronic circuitry. Representation 1220 includes data that describes all or portions of memory system 100, memory 300, memory system 400, memory component 600, memory component 700, memory component 800, memory component 900, and their components, as shown in the Figures.

Representation 1220 may include one or more of behavioral, register transfer, logic component, transistor, and layout geometry-level descriptions. Moreover, representation 1220 may be stored on storage media or communicated by carrier waves.

Data formats in which representation 1220 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1214 may comprise input parameters from a keyboard, mouse, voice recognition interface, microphone and speakers, graphical display, touch screen, or other type of user interface device. This user interface may be distributed among multiple interface devices. Parameters 1216 may include specifications and/or characteristics that are input to help define representation 1220. For example, parameters 1216 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1204 includes any suitable type, number, and/or configuration of non-transitory computer-readable storage media that stores processes 1212, user inputs 1214, parameters 1216, and circuit component 1220.

Communications devices 1206 include any suitable type, number, and/or configuration of wired and/or wireless devices that transmit information from processing system 1200 to another processing or storage system (not shown) and/or receive information from another processing or storage system (not shown). For example, communications devices 1206 may transmit circuit component 1220 to another system. Communications devices 1206 may receive processes 1212, user inputs 1214, parameters 1216, and/or circuit component 1220 and cause processes 1212, user inputs 1214, parameters 1216, and/or circuit component 1220 to be stored in memory 1204.

Implementations discussed herein include, but are not limited to, the following examples:

Example 1: A memory device, comprising: a plurality of bank group clusters; each of the bank group clusters comprising a plurality of respective bank groups; each of the bank groups comprising a plurality of respective memory banks; wherein successive accesses to different memory banks that are members of the same bank group having a first command to command delay interval for a first type of command; successive accesses to memory banks that are members of different bank groups having a second command to command delay interval for the first type of command; and, successive accesses to memory banks that are members of different bank group clusters having a third command to command delay interval for the first type of command, wherein the first command to command delay interval, the second command to command delay interval, and the third command to command delay interval are all not equal.

Example 2: The memory device of example 1, wherein the first command to command delay interval is greater than the second command to command delay interval.

Example 3: The memory device of example 1, wherein the second command to command delay interval is greater than the third command to command delay interval.

Example 4: The memory device of example 1, wherein a first level multiplexor function couples first level busses communicating data with the memory banks of a respective bank group with a respective second level bus, the first level busses operating at a first frequency.

Example 5: The memory device of example 4, wherein a second level multiplexor function couples second level busses communicating data with the bank groups of a respective bank group cluster with a respective third level bus, the third level bus operating at a third frequency.

Example 6: The memory device of example 5, wherein the third frequency is greater than the first frequency.

Example 7: The memory device of example 1, wherein the plurality of respective memory banks of a bank group are timed by clocks having the same frequency and different phase delays with respect to each other.

Example 8: A memory controller, comprising: scheduling logic to issue, to a memory device, accesses to memory banks organized into at least a plurality of bank group clusters, each bank group cluster comprising a plurality of respective bank groups where each of the bank groups comprise a plurality of respective memory banks; and, the scheduling logic to use a first delay interval for successive commands of a first type addressed to first memory banks that are members of different bank group clusters and a second delay interval for successive commands of the first type addressed to memory banks that are members of a first bank group cluster and also members of different bank groups of the first bank group cluster.

Example 9: The memory controller of example 8, wherein the scheduling logic is to use a third delay interval for successive commands of the first type addressed to second memory banks that are members of a first bank group of the first bank group cluster.

Example 10: The memory controller of example 8, wherein the first delay interval is less than the second delay interval.

Example 11: The memory controller of example 10, wherein the second delay interval is less than the third delay interval.

Example 12: The memory controller of example 8, wherein the scheduler may issue commands that result in a plurality of rows of a first memory bank of the first bank group of the first bank group cluster being open concurrently.

Example 13: The memory controller of example 8, further comprising: circuitry to associate respective indicators with a respective plurality of row address segments of the first memory bank, the row address segments corresponding to respective row address ranges.

Example 14: The memory controller of example 13, further comprising: circuitry to set the respective indicators to a first value that is associated with the respective row address segment of the first memory bank being unavailable for opening a row in the associated respective row address range, where a plurality of the respective indicators are set to the first value in response to at least the memory controller processing a command to the memory device to open a row in the respective row address range of the first memory bank associated with at least one of the respective indicators.

Example 15: A memory device, comprising: a plurality of bank groups, each of the bank groups comprising a plurality of respective memory banks; circuitry to receive commands that result in a plurality of rows of at least one memory bank being open concurrently; wherein successive commands of a first type to memory banks that are members of different bank groups have a first delay interval; and, successive commands of the first type to memory banks that are members of a same bank group have a second delay interval.

Example 16: The memory device of example 15, wherein successive commands of the first type to a first open row of a memory bank and a second open row of the memory bank have a third delay interval.

Example 17: The memory device of example 16, wherein the first delay interval, the second delay interval, and the third delay interval are all not equal.

Example 18: The memory device of example 17, wherein the first delay interval is less than the second delay interval.

Example 19: The memory device of example 16, wherein the second delay interval is less than the third delay interval.

Example 20: The memory device of example 19, further comprising: circuitry to receive a column access command that includes information used to select one of a plurality of concurrently open rows in the memory device.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory integrated circuit device, comprising:
   a command/address interface to receive access commands from an external memory controller;
   a plurality of bank group clusters;
   each of the bank group clusters comprising a plurality of respective bank groups;
   each of the bank groups comprising a plurality of respective memory banks;
   wherein successive access commands of a first type of command that are addressed to different memory banks that are members of the same bank group of the same bank group cluster are subject to a first timing constraint for receiving, from the external memory controller, the successive access commands of the first type of command that are addressed to different memory banks that are members of the same bank group of the same bank group cluster;
   successive access commands of the first type of command that are addressed to memory banks that are members of different bank groups of the same bank group cluster are subject to a second timing constraint for receiving, from the external memory controller, the successive access commands of the first type of command that are addressed to memory banks that are members of different bank groups of the same bank group cluster; and
   successive access commands of the first type of command that are addressed to memory banks that are members of different bank group clusters are subject to a third timing constraint for receiving, from the external memory controller, the successive access commands of the first type of command that are addressed to memory banks that are members of different bank group clusters, wherein the first timing constraint, the second timing constraint, and the third timing constraint are all unequal minimum time delay intervals.

2. The memory device of claim 1, wherein the first timing constraint is a first minimum time delay interval that is greater than the second timing constraint that is a second minimum time delay interval.

3. The memory device of claim 2, wherein the second second minimum time delay interval is greater than the third timing constraint that is a third minimum time delay interval.

4. The memory device of claim 1, wherein a first level multiplexor function couples first level busses communicating data with the memory banks of a respective bank group with a respective second level bus, the first level busses operating at a first frequency.

5. The memory device of claim 4, wherein a second level multiplexor function couples second level busses communicating data with the bank groups of a respective bank group cluster with a respective third level bus, the third level bus operating at a third frequency.

6. The memory device of claim 5, wherein the third frequency is greater than the first frequency.

7. The memory device of claim 1, wherein the plurality of respective memory banks of a bank group are timed by clocks having the same frequency and different phase delays with respect to each other.

8. A memory controller, comprising:
   scheduling logic to issue, to a memory integrated circuit device, accesses to memory banks of the memory integrated circuit device that are organized into at least a plurality of bank group clusters, each bank group cluster comprising a plurality of respective bank groups where each of the bank groups comprise a plurality of respective memory banks; and the scheduling logic to issue commands that conform to a first timing constraint that is a first minimum time delay interval between the issuance of successive commands of a first type that are addressed to first memory banks that are members of different bank group clusters, and to issue commands that conform to a second timing constraint that is a second minimum time delay interval between the issuance of successive commands of the first type that are addressed to memory banks that are members of a first bank group cluster and also members of different bank groups of the first bank group cluster.

9. The memory controller of claim 8, wherein the scheduling logic is to issue commands that conform to a third timing constraint that is a third minimum time delay interval between the issuance of successive commands of the first type that are addressed to second memory banks that are members of a first bank group of the first bank group cluster.

10. The memory controller of claim 9, wherein the first minimum time delay interval is less than the second minimum time delay interval.

11. The memory controller of claim 10, wherein the second minimum time delay interval is less than the third minimum time delay interval.

12. The memory controller of claim 8, wherein the scheduler may issue commands that result in a plurality of rows of a first memory bank of the first bank group of the first bank group cluster being open concurrently.

13. The memory controller of claim 8, further comprising:
circuitry to associate respective indicators with a respective plurality of row address segments of the first memory bank, the row address segments corresponding to respective row address ranges.

14. The memory controller of claim 13, further comprising:
circuitry to set the respective indicators to a first value that is associated with the respective row address segment of the first memory bank being unavailable for opening a row in the associated respective row address range, where a plurality of the respective indicators are set to the first value in response to at least the memory controller processing a command to the memory device to open a row in the respective row address range of the first memory bank associated with at least one of the respective indicators.

\* \* \* \* \*